(12) United States Patent
Larson, III et al.

(10) Patent No.: US 7,737,807 B2
(45) Date of Patent: Jun. 15, 2010

(54) ACOUSTIC GALVANIC ISOLATOR INCORPORATING SERIES-CONNECTED DECOUPLED STACKED BULK ACOUSTIC RESONATORS

(75) Inventors: John D Larson, III, Palo Alto, CA (US); Ian Hardcastle, Sunnyvale, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 381 days.

(21) Appl. No.: 11/253,444

(22) Filed: Oct. 18, 2005

(65) Prior Publication Data
US 2007/0086080 A1  Apr. 19, 2007

(51) Int. Cl.
*H03H 9/54* (2006.01)
*H03H 9/60* (2006.01)

(52) U.S. Cl. ............... 333/189; 310/318; 310/319; 310/326; 310/328; 333/187

(58) Field of Classification Search ........... 333/187, 333/189; 310/311, 318, 319, 326, 327, 328
See application file for complete search history.

(56) References Cited

U.S. PATENT DOCUMENTS

| | | |
|---|---|---|
| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandis et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,355,408 A | 10/1982 | Scarrott |
| 4,456,850 A | 6/1984 | Inoue et al. |
| 4,529,904 A | 7/1985 | Hattersley |
| 4,608,541 A | 8/1986 | Moriwaki et al. |
| 4,625,138 A | 11/1986 | Ballato |
| 4,640,756 A | 2/1987 | Wang et al. |
| 4,719,383 A | 1/1988 | Wang et al. |
| 4,769,272 A | 9/1988 | Byrne et al. |

(Continued)

FOREIGN PATENT DOCUMENTS

DE    10160617    6/2003

(Continued)

OTHER PUBLICATIONS

U.S. Appl. No. 10/971,169, filed Oct. 22, 2004, Larson III, John D., et al.

(Continued)

*Primary Examiner*—Barbara Summons

(57) ABSTRACT

Embodiments of the acoustic galvanic isolator comprise a carrier signal source, a modulator connected to receive an information signal and the carrier signal, a demodulator, and an electrically-isolating acoustic coupler connected between the modulator and the demodulator. The electrically-isolating acoustic coupler comprises series-connected decoupled stacked bulk acoustic resonators (DSBARs).

10 Claims, 7 Drawing Sheets

U.S. PATENT DOCUMENTS

| | | |
|---|---|---|
| 4,798,990 A | 1/1989 | Henoch |
| 4,819,215 A | 4/1989 | Yokoyama et al. |
| 4,836,882 A | 6/1989 | Ballato |
| 4,841,429 A | 6/1989 | Mcclanahan et al. |
| 4,906,840 A | 3/1990 | Zdeblick et al. |
| 5,048,036 A | 9/1991 | Scifres et al. |
| 5,048,038 A | 9/1991 | Brennan et al. |
| 5,066,925 A | 11/1991 | Freitag |
| 5,075,641 A | 12/1991 | Weber et al. |
| 5,111,157 A | 5/1992 | Komiak |
| 5,118,982 A | 6/1992 | Inoue et al. |
| 5,129,132 A | 7/1992 | Zdeblick et al. |
| 5,162,691 A | 11/1992 | Mariani et al. |
| 5,166,646 A | 11/1992 | Avanic et al. |
| 5,185,589 A | 2/1993 | Krishnaswamy et al. |
| 5,214,392 A | 5/1993 | Kobayashi et al. |
| 5,233,259 A | 8/1993 | Krishnaswamy et al. |
| 5,241,209 A | 8/1993 | Sasaki |
| 5,241,456 A | 8/1993 | Marcinkiewicz et al. |
| 5,262,347 A | 11/1993 | Sands |
| 5,270,492 A | 12/1993 | Fukui |
| 5,294,898 A | 3/1994 | Dworsky et al. |
| 5,361,077 A | 11/1994 | Weber |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Boloforosh |
| 5,475,351 A | 12/1995 | Uematsu et al. |
| 5,548,189 A | 8/1996 | Williams |
| 5,587,620 A | 12/1996 | Ruby et al. |
| 5,589,858 A | 12/1996 | Kadowaki et al. |
| 5,594,705 A | 1/1997 | Connor et al. |
| 5,603,324 A | 2/1997 | Oppelt et al. |
| 5,633,574 A | 5/1997 | Sage |
| 5,671,242 A | 9/1997 | Takiguchi et al. |
| 5,692,279 A | 12/1997 | Mang et al. |
| 5,705,877 A | 1/1998 | Shimada |
| 5,714,917 A | 2/1998 | Ella |
| 5,789,845 A | 8/1998 | Wadaka et al. |
| 5,835,142 A | 11/1998 | Nakamura et al. |
| 5,853,601 A | 12/1998 | Krishaswamy et al. |
| 5,864,261 A | 1/1999 | Weber |
| 5,866,969 A | 2/1999 | Shimada et al. |
| 5,872,493 A | 2/1999 | Ella |
| 5,873,153 A | 2/1999 | Ruby et al. |
| 5,873,154 A | 2/1999 | Ylilammi et al. |
| 5,894,184 A | 4/1999 | Furuhashi et al. |
| 5,894,647 A | 4/1999 | Lakin |
| 5,910,756 A | 6/1999 | Ella |
| 5,932,953 A | 8/1999 | Drees et al. |
| 5,936,150 A | 8/1999 | Korbin et al. |
| 5,953,479 A | 9/1999 | Zhou et al. |
| 5,955,926 A | 9/1999 | Uda et al. |
| 5,962,787 A | 10/1999 | Okada et al. |
| 5,969,463 A | 10/1999 | Tomita |
| 5,982,297 A | 11/1999 | Welle |
| 6,001,664 A | 12/1999 | Swirhun et al. |
| 6,016,052 A | 1/2000 | Vaughn |
| 6,040,962 A | 3/2000 | Kiyosumi |
| 6,051,907 A | 4/2000 | Ylilammi |
| 6,060,818 A | 5/2000 | Ruby et al. |
| 6,087,198 A | 7/2000 | Panasik |
| 6,090,687 A | 7/2000 | Merchant et al. |
| 6,107,721 A | 8/2000 | Lakin |
| 6,111,341 A | 8/2000 | Hirama |
| 6,111,480 A | 8/2000 | Iyama et al. |
| 6,118,181 A | 9/2000 | Merchant et al. |
| 6,124,678 A | 9/2000 | Bishop et al. |
| 6,124,756 A | 9/2000 | Yaklin et al. |
| 6,131,256 A | 10/2000 | Dydyk et al. |
| 6,150,703 A | 11/2000 | Cushman et al. |
| 6,187,513 B1 | 2/2001 | Toru |
| 6,198,208 B1 | 3/2001 | Yano et al. |
| 6,215,375 B1 | 4/2001 | Larson, III et al. |
| 6,219,263 B1 | 4/2001 | Wuidart |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,263,735 B1 | 7/2001 | Nakatani et al. |
| 6,265,246 B1 | 7/2001 | Ruby et al. |
| 6,278,342 B1 | 8/2001 | Ella |
| 6,292,336 B1 | 9/2001 | Cheng |
| 6,307,447 B1 | 10/2001 | Barber et al. |
| 6,307,761 B1 | 10/2001 | Nakagawa |
| 6,335,548 B1 | 1/2002 | Roberts et al. |
| 6,355,498 B1 | 3/2002 | Chan et al. |
| 6,366,006 B1 | 4/2002 | Boyd |
| 6,376,280 B1 | 4/2002 | Ruby et al. |
| 6,377,137 B1 | 4/2002 | Ruby |
| 6,384,697 B1 | 5/2002 | Ruby |
| 6,396,200 B2 | 5/2002 | Misu et al. |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Akihiko |
| 6,441,539 B1 | 8/2002 | Kitamura et al. |
| 6,441,702 B1 | 8/2002 | Ella et al. |
| 6,462,631 B2 | 10/2002 | Bradley et al. |
| 6,466,105 B1 | 10/2002 | Lobl et al. |
| 6,466,418 B1 | 10/2002 | Cheng |
| 6,469,597 B2 | 10/2002 | Ruby et al. |
| 6,469,909 B2 | 10/2002 | Simmons |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Ylilammi et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,496,085 B2 | 12/2002 | Ella |
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,528,344 B2 | 3/2003 | Kang |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panasik |
| 6,548,943 B2 | 4/2003 | Kaitila et al. |
| 6,549,394 B1 | 4/2003 | Williams |
| 6,550,664 B2 | 4/2003 | Bradley et al. |
| 6,559,487 B1 | 5/2003 | Kang et al. |
| 6,559,530 B2 | 5/2003 | Hinzel et al. |
| 6,564,448 B1 | 5/2003 | Oura et al. |
| 6,566,956 B2 | 5/2003 | Ohnishi et al. |
| 6,566,979 B2 | 5/2003 | Larson et al. |
| 6,580,159 B1 | 6/2003 | Fusaro et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,594,165 B2 | 7/2003 | Duerbaum et al. |
| 6,600,390 B2 | 7/2003 | Frank |
| 6,601,276 B2 | 8/2003 | Barber |
| 6,603,182 B1 | 8/2003 | Low et al. |
| 6,617,249 B2 | 9/2003 | Ruby et al. |
| 6,617,750 B2 | 9/2003 | Dummermuth et al. |
| 6,617,751 B2 | 9/2003 | Sunwoo et al. |
| 6,621,137 B1 | 9/2003 | Ma et al. |

| | | | | | | |
|---|---|---|---|---|---|---|
| 6,630,753 | B2 | 10/2003 | Malik et al. | 7,230,509 B2 | 6/2007 | Stoemmer |
| 6,635,509 | B1 | 10/2003 | Ouellet | 7,230,511 B2 | 6/2007 | Onishi et al. |
| 6,639,872 | B1 | 10/2003 | Rein | 7,242,270 B2 * | 7/2007 | Larson et al. ............... 333/187 |
| 6,651,488 | B2 | 11/2003 | Larson et al. | 7,259,498 B2 | 8/2007 | Nakatsuka et al. |
| 6,657,363 | B1 | 12/2003 | Aigner | 7,275,292 B2 | 10/2007 | Ruby et al. |
| 6,668,618 | B2 | 12/2003 | Larson et al. | 7,276,994 B2 | 10/2007 | Takeuchi et al. |
| 6,670,866 | B2 | 12/2003 | Ella et al. | 7,280,007 B2 | 10/2007 | Feng et al. |
| 6,693,500 | B2 | 2/2004 | Yang et al. | 7,281,304 B2 | 10/2007 | Kim et al. |
| 6,710,508 | B2 | 3/2004 | Ruby et al. | 7,294,919 B2 | 11/2007 | Bai |
| 6,710,681 | B2 | 3/2004 | Figueredo et al. | 7,301,258 B2 | 11/2007 | Tanaka |
| 6,713,314 | B2 | 3/2004 | Wong et al. | 7,310,861 B2 | 12/2007 | Aigner et al. |
| 6,714,102 | B2 | 3/2004 | Ruby et al. | 7,367,095 B2 | 5/2008 | Larson, III et al. |
| 6,720,844 | B1 | 4/2004 | Lakin | 7,368,857 B2 | 5/2008 | Tanaka |
| 6,720,846 | B2 | 4/2004 | Iwashita et al. | 7,369,013 B2 | 5/2008 | Fazzio et al. |
| 6,724,266 | B2 | 4/2004 | Plazza et al. | 7,388,318 B2 | 6/2008 | Yamada et al. |
| 6,738,267 | B1 | 5/2004 | Navas Sabater et al. | 7,388,454 B2 | 6/2008 | Ruby et al. |
| 6,774,746 | B2 | 8/2004 | Whatmore et al. | 7,388,455 B2 | 6/2008 | Larson, III |
| 6,777,263 | B1 | 8/2004 | Gan et al. | 7,408,428 B2 | 8/2008 | Larson, III |
| 6,787,048 | B2 | 9/2004 | Bradley et al. | 7,414,349 B2 | 8/2008 | Sasaki |
| 6,788,170 | B1 | 9/2004 | Kaitila et al. | 7,414,495 B2 | 8/2008 | Iwasaki et al. |
| 6,803,835 | B2 | 10/2004 | Frank | 7,423,503 B2 * | 9/2008 | Larson et al. ............... 333/189 |
| 6,812,619 | B1 | 11/2004 | Kaitila et al. | 7,425,787 B2 * | 9/2008 | Larson, III .................. 310/311 |
| 6,828,713 | B2 | 12/2004 | Bradley et al. | 7,439,824 B2 | 10/2008 | Aigner |
| 6,842,088 | B2 | 1/2005 | Yamada et al. | 7,545,532 B2 | 6/2009 | Muramoto |
| 6,842,089 | B2 | 1/2005 | Lee | 2002/0000646 A1 | 1/2002 | Gooch et al. |
| 6,853,534 | B2 | 2/2005 | Williams | 2002/0030424 A1 | 3/2002 | Iwata |
| 6,873,065 | B2 | 3/2005 | Haigh et al. | 2002/0063497 A1 | 5/2002 | Panasik |
| 6,873,529 | B2 | 3/2005 | Ikuta | 2002/0070463 A1 | 6/2002 | Chang et al. |
| 6,874,211 | B2 | 4/2005 | Bradley et al. | 2002/0121944 A1 | 9/2002 | Larson, III et al. |
| 6,874,212 | B2 | 4/2005 | Larson, III | 2002/0121945 A1 | 9/2002 | Ruby et al. |
| 6,888,424 | B2 | 5/2005 | Takeuchi et al. | 2002/0126517 A1 | 9/2002 | Matsukawa et al. |
| 6,900,705 | B2 | 5/2005 | Nakamura et al. | 2002/0140520 A1 | 10/2002 | Hikita et al. |
| 6,903,452 | B2 | 6/2005 | Ma et al. | 2002/0152803 A1 | 10/2002 | Larson, III et al. |
| 6,906,451 | B2 | 6/2005 | Hajime | 2002/0190814 A1 | 12/2002 | Yamada et al. |
| 6,911,708 | B2 | 6/2005 | Park | 2003/0001251 A1 | 1/2003 | Cheever et al. |
| 6,917,261 | B2 | 7/2005 | Unterberger | 2003/0006502 A1 | 1/2003 | Karpman |
| 6,924,583 | B2 | 8/2005 | Lin et al. | 2003/0011285 A1 | 1/2003 | Ossmann |
| 6,924,717 | B2 | 8/2005 | Ginsburg et al. | 2003/0011446 A1 | 1/2003 | Bradley |
| 6,927,651 | B2 | 8/2005 | Larson, III et al. | 2003/0051550 A1 | 3/2003 | Nguyen et al. |
| 6,936,928 | B2 | 8/2005 | Hedler et al. | 2003/0087469 A1 | 5/2003 | Ma |
| 6,936,954 | B2 | 8/2005 | Peczalski | 2003/0102776 A1 | 6/2003 | Takeda et al. |
| 6,943,648 | B2 | 9/2005 | Maiz et al. | 2003/0111439 A1 | 6/2003 | Fetter et al. |
| 6,946,928 | B2 | 9/2005 | Larson et al. | 2003/0128081 A1 | 7/2003 | Ella et al. |
| 6,954,121 | B2 | 10/2005 | Bradley et al. | 2003/0132493 A1 | 7/2003 | Kang et al. |
| 6,963,257 | B2 | 11/2005 | Ella et al. | 2003/0132809 A1 | 7/2003 | Senthilkumar et al. |
| 6,970,365 | B2 | 11/2005 | Turchi | 2003/0141946 A1 | 7/2003 | Ruby et al. |
| 6,975,183 | B2 | 12/2005 | Aigner et al. | 2003/0179053 A1 | 9/2003 | Aigner et al. |
| 6,977,563 | B2 | 12/2005 | Komuro et al. | 2003/0205948 A1 | 11/2003 | Lin et al. |
| 6,985,052 | B2 | 1/2006 | Tikka | 2004/0016995 A1 | 1/2004 | Kuo et al. |
| 6,987,433 | B2 | 1/2006 | Larson et al. | 2004/0017130 A1 | 1/2004 | Wang et al. |
| 6,989,723 | B2 | 1/2006 | Komuro et al. | 2004/0056735 A1 | 3/2004 | Nomura et al. |
| 6,998,940 | B2 | 2/2006 | Metzger | 2004/0092234 A1 | 5/2004 | Pohjonen |
| 7,002,437 | B2 | 2/2006 | Takeuchi et al. | 2004/0124952 A1 | 7/2004 | Tikka |
| 7,019,604 | B2 | 3/2006 | Gotoh et al. | 2004/0129079 A1 | 7/2004 | Kato et al. |
| 7,019,605 | B2 | 3/2006 | Larson et al. | 2004/0150293 A1 | 8/2004 | Unterberger |
| 7,026,876 | B1 | 4/2006 | Esfandiari et al. | 2004/0150296 A1 | 8/2004 | Park et al. |
| 7,053,456 | B2 | 5/2006 | Matsuo | 2004/0166603 A1 | 8/2004 | Carley et al. |
| 7,057,476 | B2 | 6/2006 | Hwu | 2004/0195937 A1 | 10/2004 | Matsubara et al. |
| 7,057,478 | B2 | 6/2006 | Korden et al. | 2004/0212458 A1 | 10/2004 | Lee |
| 7,064,606 | B2 | 6/2006 | Louis | 2004/0257171 A1 | 12/2004 | Park et al. |
| 7,084,553 | B2 | 8/2006 | Ludwiczak | 2004/0257172 A1 | 12/2004 | Schmidhammer et al. |
| 7,091,649 | B2 | 8/2006 | Larson | 2004/0263287 A1 | 12/2004 | Ginsburg et al. |
| 7,098,758 | B2 | 8/2006 | Wang et al. | 2005/0012570 A1 | 1/2005 | Korden et al. |
| 7,102,460 | B2 | 9/2006 | Schmidhammer et al. | 2005/0023931 A1 | 2/2005 | Bouche et al. |
| 7,128,941 | B2 | 10/2006 | Lee | 2005/0030126 A1 | 2/2005 | Inoue et al. |
| 7,138,889 | B2 | 11/2006 | Lakin | 2005/0036604 A1 | 2/2005 | Scott et al. |
| 7,161,448 | B2 | 1/2007 | Feng et al. | 2005/0057117 A1 | 3/2005 | Nakatsuka et al. |
| 7,170,215 | B2 | 1/2007 | Namba et al. | 2005/0057324 A1 | 3/2005 | Onishi et al. |
| 7,173,504 | B2 | 2/2007 | Larson | 2005/0068124 A1 | 3/2005 | Stoemmer |
| 7,187,254 | B2 | 3/2007 | Su et al. | 2005/0093396 A1 | 5/2005 | Larson et al. |
| 7,209,374 | B2 | 4/2007 | Noro | 2005/0093653 A1 | 5/2005 | Larson, III |
| 7,212,083 | B2 | 5/2007 | Inoue et al. | 2005/0093654 A1 | 5/2005 | Larson, III et al. |
| 7,212,085 | B2 | 5/2007 | Wu | 2005/0093655 A1 | 5/2005 | Larson, III et al. |

| | | | |
|---|---|---|---|
| 2005/0093657 A1 | 5/2005 | Larson et al. |
| 2005/0093658 A1 | 5/2005 | Larson, III et al. |
| 2005/0093659 A1 | 5/2005 | Larson, III et al. |
| 2005/0104690 A1 | 5/2005 | Larson, III et al. |
| 2005/0110598 A1 | 5/2005 | Larson, III |
| 2005/0128030 A1 | 6/2005 | Larson et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0206483 A1 | 9/2005 | Pashby et al. |
| 2005/0218488 A1 | 10/2005 | Mie |
| 2006/0081048 A1 | 4/2006 | Mikado et al. |
| 2006/0103492 A1 | 5/2006 | Feng et al. |
| 2006/0119453 A1 | 6/2006 | Fattinger et al. |
| 2006/0125489 A1 | 6/2006 | Feucht et al. |
| 2006/0132262 A1 | 6/2006 | Fazzlo et al. |
| 2006/0164183 A1 | 7/2006 | Tikka |
| 2006/0185139 A1 | 8/2006 | Larson, III et al. |
| 2006/0197411 A1 | 9/2006 | Hoen et al. |
| 2006/0238070 A1 | 10/2006 | Costa et al. |
| 2006/0284707 A1 | 12/2006 | Larson et al. |
| 2006/0290446 A1 | 12/2006 | Aigner et al. |
| 2007/0037311 A1 | 2/2007 | Izumi et al. |
| 2007/0080759 A1 | 4/2007 | Jamneala et al. |
| 2007/0084964 A1 | 4/2007 | John et al. |
| 2007/0085447 A1 | 4/2007 | Larson |
| 2007/0170815 A1 | 7/2007 | Unkrich |
| 2007/0171002 A1 | 7/2007 | Unkrich |
| 2007/0205850 A1 | 9/2007 | Jamneala et al. |
| 2007/0279153 A1 | 12/2007 | Ruby |
| 2008/0055020 A1 | 3/2008 | Handtmann |
| 2008/0297279 A1 | 12/2008 | Thalhammer et al. |
| 2008/0297280 A1 | 12/2008 | Thalhammer et al. |

FOREIGN PATENT DOCUMENTS

| | | |
|---|---|---|
| EP | 231892 | 8/1987 |
| EP | 0637875 | 2/1995 |
| EP | 689254 | 12/1995 |
| EP | 0865157 | 9/1998 |
| EP | 0880227 | 11/1998 |
| EP | 0973256 | 1/2000 |
| EP | 1047189 | 10/2000 |
| EP | 1100196 | 11/2000 |
| EP | 1096259 | 5/2001 |
| EP | 1258990 | 11/2002 |
| EP | 1180494 | 3/2003 |
| EP | 1542362 | 6/2003 |
| EP | 1258989 | 1/2004 |
| EP | 1528674 | 6/2004 |
| EP | 1528675 | 6/2004 |
| EP | 1528677 | 7/2004 |
| EP | 1249932 | 3/2005 |
| EP | 1517443 | 3/2005 |
| EP | 1517444 | 3/2005 |
| EP | 1557945 | 7/2005 |
| EP | 1575165 | 9/2005 |
| GB | 1 207 974 | 11/1967 |
| GB | 2013343 | 8/1979 |
| GB | 2411239 | 8/2005 |
| GB | 2418791 | 4/2006 |
| GB | 2427773 | 1/2007 |
| JP | 61054686 | 3/1986 |
| JP | 06005944 | 1/1994 |
| JP | 2002/217676 | 8/2002 |
| JP | 2003/124779 | 4/2003 |
| WO | WO 98/16957 | 4/1998 |
| WO | WO-98/16957 | 4/1998 |
| WO | WO-01/06647 | 1/2001 |
| WO | WO-01/99276 | 12/2001 |
| WO | WO-02/103900 | 12/2002 |
| WO | WO-03/030358 | 4/2003 |
| WO | WO-03/043188 | 5/2003 |
| WO | WO 03/050950 | 6/2003 |
| WO | WO-03/058809 | 7/2003 |
| WO | WO-2004/034579 | 4/2004 |
| WO | WO-2004/051744 | 6/2004 |
| WO | WO-2004/102688 | 11/2004 |
| WO | WO-2005/043752 | 5/2005 |
| WO | WO-2005/043753 | 5/2005 |
| WO | WO-2005/043756 | 5/2005 |
| WO | WO-2006/018788 | 2/2006 |

OTHER PUBLICATIONS

Holzlohner, Ronald et al., "Accurate Calculation of Eye Diagrams and Bit Error Rates in Optical Transmission Systems Using Linearization", *Journal of Lightwave Technology*, vol. 20, No. 3,, (Mar. 2002),pp. 389-400.

Reinhardt, Alexandre et al., "Design of Coupled Resonator Filters Using Admittance and Scattering Matrices", *2003 IEEE Ultrasonics Symposium*, (May 3, 2003),1428-1431.

Navas, J. et al., "Miniaturised Battery Charger using Piezoelectric Transformers", *IEEE*, (2001),492-496.

Jiang, Yimin et al., "A Novel Single-Phase Power Factor Correction Scheme", *IEEE*, (1993),287-292.

Lakin, K.M. "Coupled Resonator Filters", *2002 IEEE Ultrasonics Symposium*, (Mar. 2, 2002),901-908.

Lakin, K.M. et al., "High Performance Stacked Crystal Filters for GPS and Wide Bandwidth Applications", *2001 IEEE Ultrasonics Symposium*, (Jan. 1, 2001),833-838.

Krishnaswamy, S.V. et al., "Film Bulk Acoustic Wave Resonator Technology", (May 29, 1990),529-536.

Lobl, H.P. et al., "Piezoelectric Materials for BAW Resonators and Filters", *2001 iEEE Ultrasonics Symposium*, (Jan. 1, 2001),807-811.

Lakin, K.M. "Bulk Acoustic Wave Coupled Resonator Filters", *2002 IEEE International Frequency Control Symposium and PDA Exhibition*, (Jan. 2, 2002),8-14.

Jung, Jun-Phil et al., "Experimental and Theoretical Investigation on the Relationship Between AIN Properties and AIN-Based FBAR Characteristics", *2003 IEEE International Frequency Control Symposium and PDA Exhibition Jointly with the 17th European Frequency and Time Forum*, (Sep. 3, 2003),779-784.

Yang, C.M. et al., "Highly C Axis Oriented AIN Film Using MOCVD for 5GHx Band FBAR Filter", *2003 IEEE Ultrasonics Symposium*, (Oct. 5, 2003),pp. 170-173.

Hadimioglu, B. et al., ""Polymer Films As Acoustic Matching Layers".", *1990 IEEE Ultrasonics Symposium Proceedings*, vol. 3 PP., [Previously submitted as "Polymer Files as Acoustic Matching Layers, 1990 IEEE Ultrasonics Sympsoium Proceeding, vol. 4 pp. 1227-1340, Dec. 1990". Considered by Examiner on Mar. 20, 2007,(Dec. 1990),1337-1340.

"Examination Report from UK for application", GB 0605971.1, (Aug. 24, 2006).

"Examination report corresponding to application No.", GB0605770.7, (Aug. 25, 2006).

"Examination Report corresponding to application No.", GB0605775.6, (Aug. 30, 2006).

"Search report from corresponding application No.", GB0620152.9, (Nov. 15, 2006).

"Search report from corresponding application No.", GB0620655.1, (Nov. 17, 2006).

"Search report from corresponding application No.", GB0620653.6, (Nov. 17, 2006).

"Search Report from corresponding application No.", GB0620657.7, (Nov. 23, 2006).

Coombs, Clyde F., et al., "Electronic Instrument Handbook", *Second Edition, McGraw-Hill, Inc.*, (1995),pp. 5.1 to 5.29.

"A partial GB Search Report for", Application No. GB0522393.8, (Jan. 9, 2006),4 pages.

"A partial GB Search Report for Application No.", GB0525884.3, (Feb. 2, 2006),4 pgs.

Auld, B. A., "Acoustic Resonators", *Acoustic Fields and Waves in Solids, Second Edition*, vol. II, (1990),250-259.

"British Search Report Application No.", 0605222.9, (Jul. 11, 2006).

Tiersten, H. F., et al., "An Analysis of Thiskness-Extensional Trapped Energy Resonant Device Structures with Rectangular Electrodes in the Piezoelectric Thin Film on Silicon Configuration", *J. Appl. Phys.* 54 (10), (Oct. 1983),5893-5910.

"Search Report from corresponding application", No. GB0605225.2, (Jun. 26, 2006).

"Search Report for Great Britain Patent Application", No. 0617742.2, (Mar. 29, 2007).

"Search Report for Great Britain Patent Application", No. 0617742.2, (Dec. 13, 2006).

"Search Report in the Great Britian Patent Application", No. 0619698.4, (Nov. 30, 2006).

Ruby, R. et al., "The Effect of Perimeter Geometry on FBAR Resonator Electrical Performance", *Microwave Symposium Digest, 2005 IEEE MTT-S International*, (Jun. 12, 2005),217-221.

Schuessler, Hans H., "Ceramic Filters and Resonators", *Reprinted from IEEE Trans. Sonics Ultrason.*, vol. SU-21, (Oct. 1974),257-268.

Fattinger, G. G., et al., "Coupled Bulk Acoustic Wave Resonator Filters: Key technology for single-to-balanced RF filters", 0-7803-8331-1/4/W20.00; *IEEE MTT-S Digest*, (2004),927-929.

Choi, Sungjin et al., "Design of Half-Bridge Piezo-Transformer Converters in the AC Adapter Applications", *IEEE 2005*, 244-248.

Li, Yunxiu et al., "AC-DC Converter with Worldwide Range Input Voltage by Series and Parallel Piezoelectric Transformer Connection", *35th Annual IEEE Power Electronics Specialists Conference*, (2004).

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6., (Nov. 2004).

Examination report from corresponding application No. GB0605779.8 dated Aug. 23, 2006.

Martin et al., "Development of Low-Dielectric Constant Polymer for Fabrication of Integrated Circuit Interconnect", 12 Advanced Materials, 1769 (2000).

U.S. Appl. No. 10/971,169, filed Oct. 22, 2004, John D. Larson III et al.

U.S. Appl. No. 11/253,464, filed Oct. 18, 2005, John D. Larson III et al.

U.S. Appl. No. 11/253,851, filed Oct. 18, 2005, John D. Larson III.

U.S. Appl. No. 11/253,508, filed Oct. 18, 2005, John D. Larson III.

U.S. Appl. No. 11/253,463, filed Oct. 18, 2005, John D. Larson III et al.

U.S. Appl. No. 11/252,845, filed Oct. 18, 2005, Ken Nishimura et al.

Al-Ahmad, M. et al., "Piezoelectric-Based Tunable Microstrip Shunt Resonator", *Proceedings of Asia-Pacific Microwave Conference* 2006.

Aoyama, Takayuki et al., "Diffusion of Boron, Phosphorous, Arsenic and Antimony in Thermally Grown SiliconDioxide", *Journal of the Electrochemical Society*, vol. 146, No. 5 1999, 1879-1883.

Bauer, L. O. et al., "Properties of Silicon Implanted with Boron Ions through Thermal Silicon Dioxide", *Solid State Electronics*, vol. 16, No. 3 Mar. 1973, 289-300.

Hara, K., "Surface Treatment of Quartz Oscillator Plate by Ion Implantation", *Oyo Buturi*, vol. 47, No. 2 Feb. 1978, 145-146.

Lakin, K. M. et al., "Temperature Compensated Bulk Acoustic Thin Film Resonators", *IEEE Ultrasonics Symposium*, San Juan, Puerto Rico Oct. 2000, 855-858.

Lakin, K.M., "Thin Film BAW Filters for Wide Bandwidth and High Performance Applications", *IEEE Microwave Symposium Digest*; vol. 2 Jun. 6-11, 2004, 923-926.

Lakin, K. M. "Thin Film Resonators and Filters", *IEEE Untrasonics Symposium*, Caesar's Tahoe, NV Oct. 1999, 895-906.

Lakin, et al., "Wide Bandwidth Thin Film BAW Filters", *2004 IEEE Ultrasonics Symposium*, vol. 1, Aug. 2004, 407-410.

Larson III, John D. et al., "Measurement of Effective Kt2,Q,Rp,Rs vs. Temperature for Mo/AlN FBAR Resonators", *IEEE Ultrasonics Symposium* 2002, 939-943.

Ng, J. et al., "The Diffusion Ion-Implanted Boron in Silicon Dioxide", *AIP Conf. Proceedings*, No. 122 1984, 20-33.

Ohta, S. et al., "Temperature Characteristics of Solidly Mounted Piezoelectric Thin Film Resonators", *IEEE Ultrasonics Symposium*, Honolulu, HI Oct. 2003, 2011-2015.

Parker, T. E. et al., "Temperature-Compensated Surface Acoustic-Wave Devices with SiO2 Film Overlays", *J. Appl. Physics*, vol. 50 1360-1369, Mar. 1979.

Ruby, R. C., "MicroMachined Thin Film Bulk Acoustic Resonators", *IEEE International Frequency Control Symposium* 1994, 135-138.

Sanchez, A.M. et al., "Mixed analytical and numerical design method for piezoelectric transformers", *IEEE,PESX* Jun. 2003, 841-846.

Spangenberg, B. et al., "Dependence of the Layer Resistance of Boron Implantation in Silicon and the Annealing Conditions", *Comptus Rendus de l'Academic Bulgare des Sciences*, vol. 33, No. 3 1980, 325-327.

Topich, J. A. et al., "Effects of Ion Implanted Flourine in Silicon Dioxide", *Nuclear Instr. And Methods, Cecon Rec*, Cleveland, OH May 1978, 70-73.

Tsubbouchi, K. et al., "Zero Temperature coefficient Surface Acoustic Wave Devices using Epitaxial AlN Films", *IEEE Ultrasonic symposium*, San Diaego, CA, 1082 1982, 240-245.

Vasic, D et al., "A New Method to Design Piezoelectric Transformer Used in MOSFET & IGBT Drive Circuits", *IEEE 34th Anuual Power Electronics Specialists Conference*, 2003 vol. 1 Jun. 15-19, 2003, 307-312.

Vasic, D et al., "A New MOSFET & IGBT Gate Drive Insulated By A Piezoelectric Transformer", *IEEE 32 nd Annual Power Electronics Specialists Conference*, 2001 vol. 3 2001, 1479-1484.

\* cited by examiner

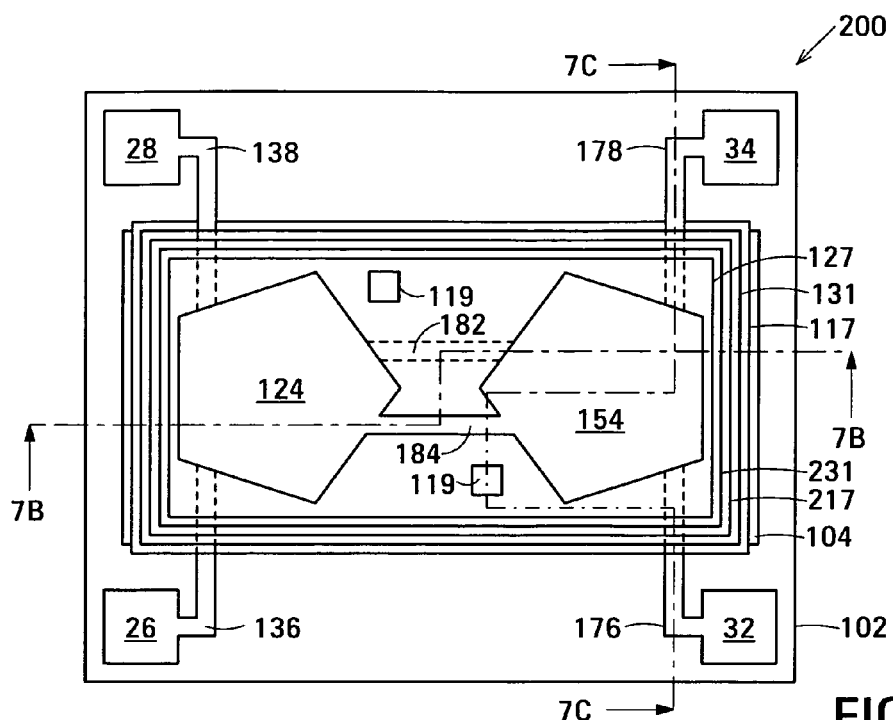
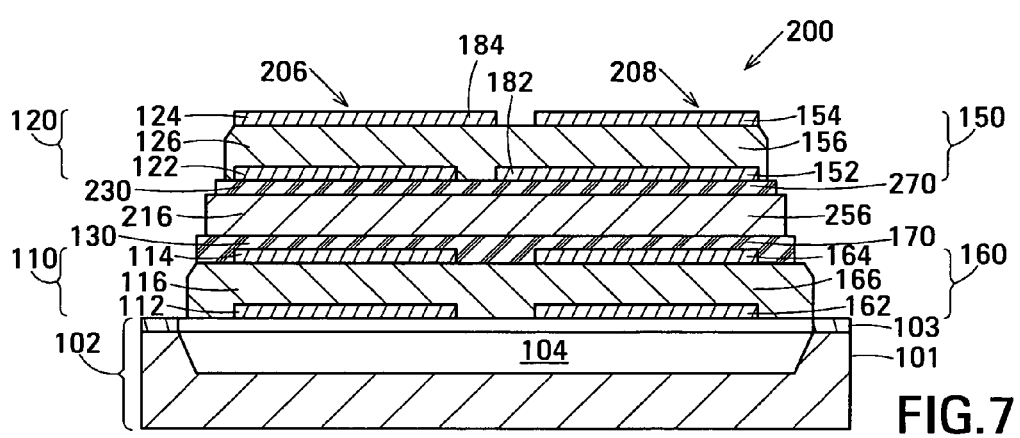
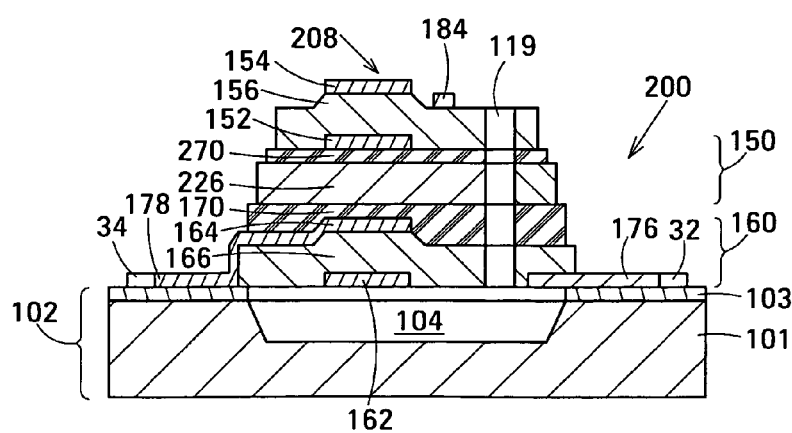
FIG.7A
FIG.7B
FIG.7C

ACOUSTIC GALVANIC ISOLATOR INCORPORATING SERIES-CONNECTED DECOUPLED STACKED BULK ACOUSTIC RESONATORS

RELATED APPLICATIONS

This disclosure is related to the following simultaneously-filed disclosures: Acoustic Galvanic Isolator Incorporating Single Decoupled Stacked Bulk Acoustic Resonator of John D. Larson III Ser. No. 11/253,851; Acoustic Galvanic Isolator Incorporating Single Insulated Decoupled Stacked Bulk Acoustic Resonator With Acoustically-Resonant Electrical Insulator of John D. Larson III Ser. No. 11/253,508; Acoustic Galvanic Isolator Incorporating Film Acoustically-Coupled Transformer of John D. Larson III et al. Ser. No. 11/253,463; and Acoustic Galvanic Isolator of John D. Larson III et al. Ser. No. 11/253,464, all of which are assigned to the assignee of this disclosure and are incorporated by reference.

BACKGROUND

A galvanic isolator allows an information signal to pass from its input to its output but has no electrical conduction path between its input and its output. The lack of an electrical conduction path allows the galvanic isolator to prevent unwanted voltages from passing between its input and its output. Strictly speaking, a galvanic isolator blocks only DC voltage, but a typical galvanic isolator additionally blocks a.c. voltage, such as voltages at power line and audio frequencies. An example of a galvanic isolator is a data coupler that passes a high data rate digital information signal but blocks DC voltages and additionally blocks low-frequency a.c. voltages.

One example of a data coupler is an opto-isolator such as the opto-isolators sold by Agilent Technologies, Inc. In an opto-isolator, an electrical information signal is converted to a light signal by a light-emitting diode (LED). The light signal passes through an electrically non-conducting light-transmitting medium, typically an air gap or an optical waveguide, and is received by a photodetector. The photodetector converts the light signal back to an electrical signal. Galvanic isolation is provided because the light signal can pass through the electrically non-conducting light-transmitting medium without the need of metallic conductors.

Other data couplers include a transformer composed of a first coil magnetically coupled to a second coil. Passing the electrical information signal through the first coil converts the electrical information signal to magnetic flux. The magnetic flux passes through air or an electrically non-conducting permeable magnetic material to the second coil. The second coil converts the magnetic flux back to an electrical signal. The transformer allows the high data rate information signal to pass but blocks transmission of DC voltages and low-frequency a.c. voltages. The resistance of the conveyor of the magnetic flux is sufficient to prevent DC voltages and low-frequency a.c. voltages from passing from input to output. Blocking capacitors are sometimes used to provide similar isolation.

Inexpensive opto-isolators are typically limited to data rates of about 10 Mb/s by device capacitance, and from power limitations of the optical devices. The transformer approach requires that the coils have a large inductance yet be capable of transmitting the high data rate information signal. Such conflicting requirements are often difficult to reconcile. Using capacitors does not provide an absolute break in the conduction path because the information signal is transmitted electrically throughout. More successful solutions convert the electrical information signal to another form of signal, e.g., light or a magnetic flux, and then convert the other form of signal back to an electrical signal. This allows the electrical path between input and output to be eliminated.

Many data transmission systems operate at speeds of 100 Mb/s. What is needed is a compact, inexpensive galvanic isolator capable of operating at speeds of 100 Mb/s and above. What is also needed is a compact, inexpensive galvanic isolator capable of blocking a.c. signals at frequencies close to those of the information signal.

SUMMARY OF THE INVENTION

In a first aspect, the invention provides an acoustic galvanic isolator. Embodiments of the acoustic galvanic isolator comprise a carrier signal source, a modulator connected to receive an information signal and the carrier signal, a demodulator, and an electrically-isolating acoustic coupler connected between the modulator and the demodulator. The electrically-isolating acoustic coupler comprises series-connected decoupled stacked bulk acoustic resonators (DSBARs).

In a second aspect, the invention provides a method for galvanically isolating an information signal. Embodiments of the method comprise providing an electrically-isolating acoustic coupler comprising series-connected decoupled stacked bulk acoustic resonators (DSBARs); providing a carrier signal; modulating the carrier signal with the information signal to form a modulated electrical signal; acoustically coupling the modulated electrical signal through the electrically-isolating acoustic coupler; and recovering the information signal from the modulated electrical signal acoustically coupled through the electrically-isolating acoustic coupler.

An electrically-isolating acoustic coupler comprising series-connected decoupled stacked bulk acoustic resonators (DSBARs) is physically small and is inexpensive to fabricate yet is capable of acoustically coupling information signals having data rates in excess of 100 Mbit/s and of withstanding a substantial DC or a.c. voltage between its inputs and its outputs.

BRIEF DESCRIPTION OF THE DRAWINGS

FIG. 7A is a plan view showing a practical example of the acoustic coupler shown in FIG. 6.

FIGS. 7B and 7C are cross-sectional views along section lines 7B-7B and 7C-7C, respectively, shown in FIG. 7A.

DETAILED DESCRIPTION

Figure 1:
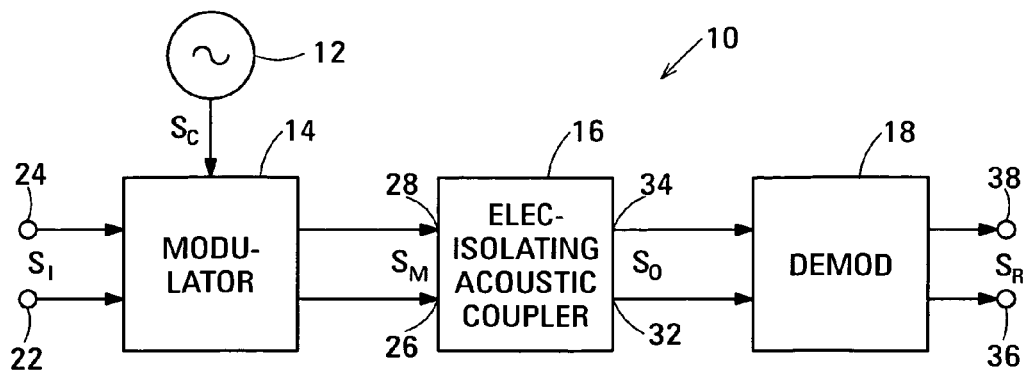
FIG. 1 is a block diagram showing an acoustic galvanic isolator in accordance with an embodiment of the invention.

FIG. 1 is a block diagram showing an acoustic galvanic isolator 10 in accordance with a first embodiment of the invention. Acoustic galvanic isolator 10 transmits an electrical information signal $S_I$ between its input terminals and its output terminals yet provides electrical isolation between its input terminals and its output terminals. Acoustic galvanic isolator 10 not only provides electrical isolation at DC but also provides a.c. electrical isolation. Electrical information signal $S_I$ is typically a high data rate digital data signal, but may alternatively be an analog signal. In one application, electrical information signal $S_I$ is a 100 Mbit/sec Ethernet signal.

In the example shown, acoustic galvanic isolator 10 is composed of a local oscillator 12, a modulator 14, an electrically-isolating acoustic coupler 16 and a demodulator 18. In the example shown, local oscillator 12 is the source of an electrical carrier signal $S_C$. Modulator 14 has an input connected to receive electrical information signal $S_I$ from input terminals 22, 24 of acoustic galvanic isolator 10 and an input connected to receive carrier signal $S_C$ from local oscillator 12. Modulator 14 has outputs connected to inputs 26, 28 of electrically-isolating acoustic coupler 16.

Electrically-isolating acoustic coupler 16 provides a balanced output at outputs 34 and 36. Outputs 32, 34 of electrically-isolating acoustic coupler 16 are connected to the inputs of demodulator 18. The outputs of demodulator 18 are connected to output terminals 36, 38 of acoustic galvanic isolator 10.

Figure 3:
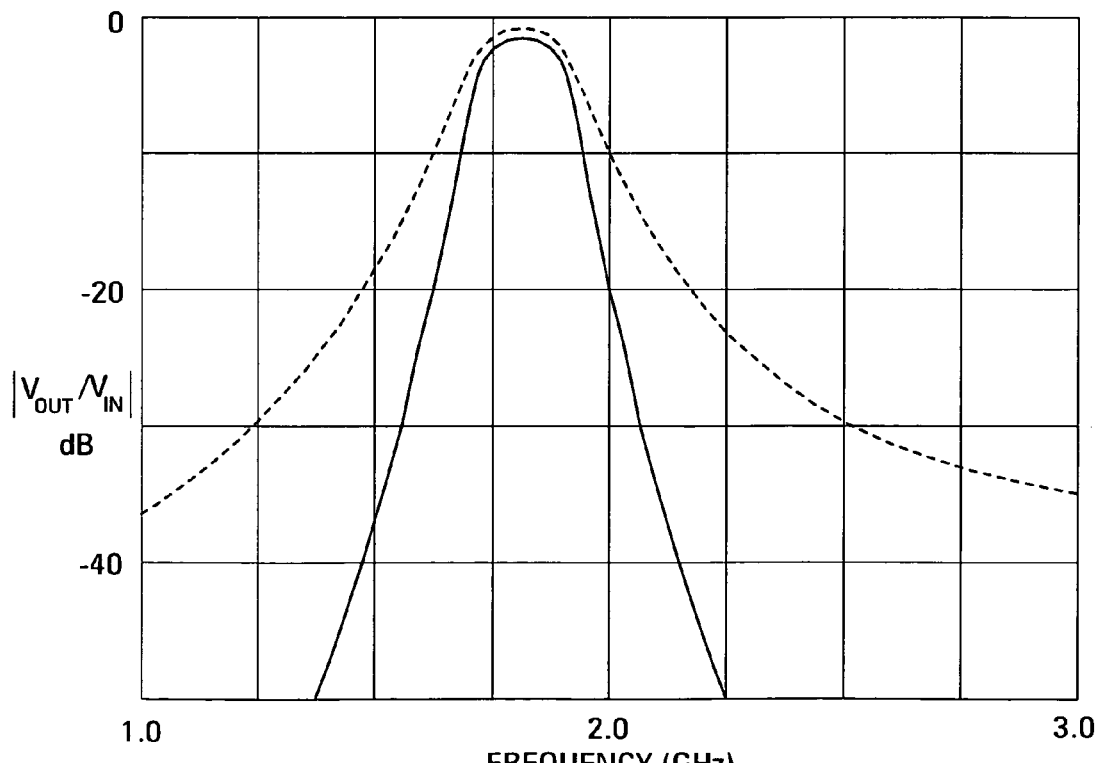
FIG. 3 is a graph showing the frequency response characteristic of an exemplary embodiment of the acoustic coupler shown in FIG. 2 (solid line) and of one of its constituent decoupled stacked bulk acoustic resonators (DSBARs).

Electrically-isolating acoustic coupler 16 has a band-pass frequency response that will be described in more detail below with reference to FIG. 3. Local oscillator 12 generates carrier signal $S_C$ at a frequency nominally at the center of the pass band of electrically-isolating acoustic coupler 16. In one exemplary embodiment of acoustic galvanic isolator 10, the pass band of electrically-isolating acoustic coupler 16 is centered at a frequency of 1.9 GHz, and local oscillator 12 generated carrier signal $S_C$ at a frequency of 1.9 GHz. Local oscillator 12 feeds carrier signal $S_C$ to the carrier signal input of modulator 14.

Modulator 14 receives electrical information signal $S_I$ from input terminals 22, 24 and modulates carrier signal $S_C$ with electrical information signal $S_I$ to generate modulated electrical signal $S_M$. Typically, modulated electrical signal $S_M$ is carrier signal $S_C$ modulated in accordance with electrical information signal $S_I$. Any suitable modulation scheme may be used. In an example in which carrier signal is amplitude modulated by electrical information signal $S_I$ and electrical information signal $S_I$ is a digital signal having low and high signal levels respectively representing 0s and 1s, modulated electrical signal $S_M$ has small and large amplitudes respectively representing the 0s and 1s of the electrical information signal.

As will be described in more detail below with reference to FIGS. 2 and 4A-4C, electrically-isolating acoustic coupler 16 acoustically couples modulated electrical signal $S_M$ from its inputs 26, 28 to its outputs 32, 34 to provide an electrical output signal $S_O$ to the inputs of demodulator 18. Electrical output signal $S_O$ is similar to modulated electrical signal $S_M$, i.e., it is a modulated electrical signal having the same frequency as carrier signal $S_C$, the same modulation scheme as modulated electrical signal $S_M$ and the same information content as electrical information signal $S_I$. Demodulator 18 demodulates electrical output signal $S_O$ to recover electrical information signal $S_I$ as recovered electrical information signal $S_R$. Recovered electrical information signal $S_R$ is output from demodulator 18 to output terminals 36, 38.

Demodulator 18 comprises a detector (not shown) that recovers electrical information signal $S_I$ from electrical output signal $S_O$ as is known in the art. In an example, the detector rectifies and integrates electrical output signal $S_O$ to recover electrical information signal $S_I$. Typically, in an embodiment intended for applications in which electrical information signal $S_I$ is a digital signal, demodulator 18 additionally includes a clock and data recovery (CDR) circuit following the detector. The CDR circuit operates to clean up the waveform of the raw electrical information signal recovered from the electrical output signal $S_O$ to generate recovered electrical information signal $S_R$. Demodulator 18 provides the recovered electrical information signal $S_R$ to the output terminals 36, 38 of acoustic galvanic isolator 10.

Circuits suitable for use as local oscillator 12, modulator 14 and demodulator 18 of acoustic galvanic isolator 10 are known in the art. Consequently, local oscillator 12, modulator 14 and demodulator 18 will not be described in further detail.

In the embodiment shown in FIG. 1, local oscillator 12 is shown as part of acoustic galvanic isolator 10. In other embodiments, instead of a local oscillator, acoustic galvanic isolator 10 has carrier signal input terminals (not shown) via which the acoustic galvanic isolator receives the carrier signal $S_c$ from an external carrier signal generator. In such embodiments, the carrier signal input terminals provide the carrier signal source for the acoustic galvanic isolator.

Acoustic couplers in according with embodiments of the invention that can be used as acoustically-isolating acoustic coupler 16 in acoustic galvanic isolator 10 will now be described. Such embodiments all have a band-pass frequency response, as will be described in more detail below with reference to FIG. 3. The pass-band of the acoustic coupler is characterized by a center frequency and a bandwidth. The bandwidth of the pass-band determines the maximum data rate of the information signal that can be acoustically coupled by the acoustic coupler. For simplicity, the center frequency of the pass band of the acoustic coupler will be referred to as the center frequency of the acoustic coupler. As will be described further below, the acoustic coupler embodiments are composed in part of layers of various acoustically-transmissive materials whose thickness depends on the wavelength in the acoustically-transmissive material of an acoustic signal nominally equal in frequency to the center frequency of the acoustic coupler. In acoustic galvanic isolator 10 shown in FIG. 1, the frequency of carrier signal $S_C$ is nominally equal to the center frequency of the acoustic coupler used as electrically-isolating acoustic coupler 16.

In this disclosure, the term quarter-wave layer will be used to denote a layer of acoustically-transmissive material having a nominal thickness t equal to an odd integral multiple of one quarter of the wavelength in the material of an acoustic signal nominal equal in frequency to the center frequency of the acoustic coupler, i.e.:

$$t \approx (2m+1)\lambda_n/4 \qquad (1)$$

where $\lambda_n$ is the wavelength of the above-mentioned acoustic signal in the acoustically-transmissive material and m is an integer equal to or greater than zero. The thickness of a quarter-wave layer may differ from the nominal thickness by approximately ±10% of $\lambda_n/4$. A thickness outside this tolerance range can be used with some degradation in performance, but the thickness of a quarter-wave layer always differs significantly from an integral multiple of $\lambda_n/2$.

Moreover, in this disclosure, a quarter wave layer having a thickness equal to a specific number of quarter wavelengths of the above-mentioned acoustic signal in the material of the layer will be denoted by preceding the term quarter-wave layer by a number denoting the number of quarter wavelengths. For example, the term one quarter-wave thickness layer will be used to denote a layer of acoustically-transmissive material having a nominal thickness t equal to one quarter of the wavelength in the material of an acoustic signal equal in frequency to the center frequency of the acoustic coupler, i.e., $t \approx \lambda_n/4$ (m=0 in equation (1)). A one quarter-wave thickness layer is a quarter-wave layer of a least-possible thickness. Similarly, a three quarter-wavelength layer has a nominal thickness t equal to three quarters of the wavelength in the material of the above-mentioned acoustic signal, i.e., $t \approx 3\lambda_n/4$ (m=1 in equation (1)).

The term half-wave layer will be used to denote a layer of acoustically-transmissive material having a nominal thickness t equal to an integral multiple of one half of the wavelength in the material of an acoustic signal equal in frequency to the center frequency of the acoustic coupler, i.e.:

$$t \leq n\lambda_n/2 \qquad (2)$$

where n is an integer greater than zero. The thickness of a half-wave layer may differ from the nominal thickness by approximately ±10% of $\lambda_n/2$. A thickness outside this tolerance range can be used with some degradation in performance, but the thickness of a half-wave layer always differs significantly from an odd integral multiple of $\lambda_n/4$. The term half-wave layer may be preceded with a number to denote a layer having a thickness equal to a specific number of half wavelengths of the above-mentioned acoustic signal in the material of the layer.

Acoustic galvanic isolators and their constituent electrically-isolating acoustic couplers are characterized by a breakdown voltage. The breakdown voltage of an acoustic galvanic isolator is the voltage that, when applied between the input terminals and output terminals of the acoustic galvanic isolator, causes a leakage current greater than a threshold leakage current to flow. In acoustic galvanic isolators with multiple input terminals and multiple output terminals, as in this disclosure, the input terminals are electrically connected to one another and the output terminals are electrically connected to one another to make the breakdown voltage measurement. The breakdown voltage of an electrically-isolating acoustic coupler is the voltage that, when applied between the inputs and outputs of the acoustically-resonant electrical insulator, causes a leakage current greater than a threshold leakage current to flow. In electrically-isolating acoustic couplers with multiple inputs and multiple outputs, as in this disclosure, the inputs are electrically connected to one another and the outputs are electrically connected to one another to make the breakdown voltage measurement. The threshold leakage current is application-dependent, and is typically of the order of microamps.

Figure 2:
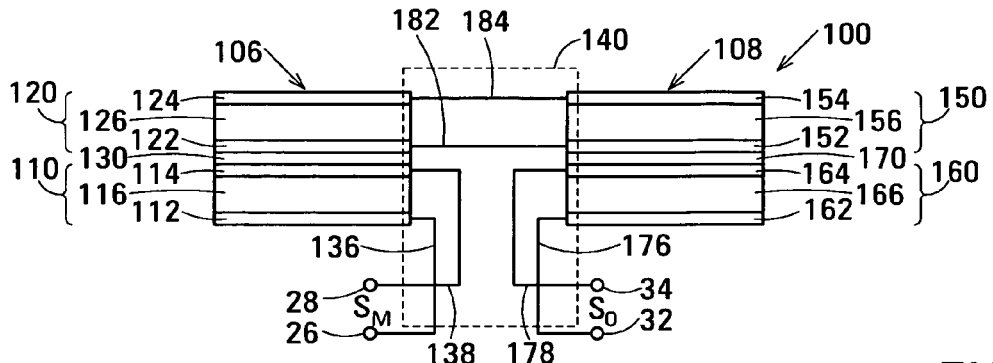
FIG. 2 is a schematic diagram showing an example of an acoustic coupler in accordance with a first embodiment of the invention that may be used as the electrically-isolating acoustic coupler of the acoustic galvanic isolator shown in FIG. 1.

FIG. 2 is a schematic diagram showing an example of an acoustic coupler 100 in accordance with a first embodiment of the invention. Acoustic coupler 100 comprises inputs 26, 28, outputs 32, 34, a first decoupled stacked bulk acoustic resonator (DSBAR) 106, a second DSBAR 108 and an electrical circuit 140 that connects DSBARs 106 and 108 in series between inputs 26, 28 and outputs 32, 34. DSBAR 106 comprises an acoustic decoupler 130 and DSBAR 108 comprises an acoustic decoupler 170. At least one of acoustic decoupler 130 and acoustic coupler 170 is electrically insulating and electrically isolates inputs 26, 28 from outputs 32, 34. Typically, acoustic decoupler 130 and acoustic coupler 170 are both electrically insulating. Electrically-insulating acoustic couplers 130 and 170 are in series between inputs 26, 28 and outputs 32, 34.

When used as electrically-isolating acoustic coupler 16 in acoustic galvanic isolator 10 shown in FIG. 1, acoustic coupler 100 acoustically couples modulated electrical signal $S_M$ from inputs 26, 28 to outputs 32, 34 while providing electrical isolation between inputs 26, 28 and outputs 32, 34. Thus, acoustic coupler 100 effectively galvanically isolates output terminals 36, 38 from input terminals 22, 24, and allows the output terminals to differ in voltage from the input terminals by a voltage up to its specified breakdown voltage.

Each of DSBAR 106 and DSBAR 108 comprises a first film bulk acoustic resonator (FBAR), a second FBAR and an acoustic decoupler between the FBARs. Each FBAR has opposed planar electrodes and a piezoelectric element between the electrodes. Specifically, first DSBAR 106 is composed of a first FBAR 110, a second FBAR 120 and an electrically-insulating acoustic decoupler 130 between the FBARs. Second DSBAR 108 is composed of a first FBAR 150, a second FBAR 160 and an electrically-insulating acoustic decoupler 170 between the FBARs. In the example shown, second FBAR 120 is stacked on first FBAR 110 and first FBAR 150 is stacked on second FBAR 160. Alternatively, first FBAR 110 may be stacked on second FBAR 120 and second FBAR 160 may be stacked on first FBAR 150.

In first DSBAR 106, first FBAR 110 is composed of opposed planar electrodes 112 and 114 and a piezoelectric element 116 between electrodes 112 and 114, and second FBAR 120 is composed of opposed planar electrodes 122 and 124 and a piezoelectric element 126 between electrodes 122 and 124. Electrically-insulating acoustic decoupler 130 is located between electrode 114 of FBAR 110 and electrode 122 of FBAR 120. In second DSBAR 108, first FBAR 150 is composed of opposed planar electrodes 152 and 154 and a piezoelectric element 156 between electrodes 152 and 154, and second FBAR 160 is composed of opposed planar electrodes 162 and 164 and a piezoelectric element 166 between electrodes 162 and 164. Electrically-insulating acoustic decoupler 170 is located between electrode 152 of FBAR 150 and electrode 164 of FBAR 160.

Electrical circuit 140 is composed of conductors 136, 138, 176, 178, 182 and 184. Conductors 136 and 138 respectively electrically connect inputs 26, 28 to the electrodes 112 and 114, respectively, of the first FBAR 110 of first DSBAR 106. Conductors 182 and 184 connect DSBARs 106 and 108 in series by respectively connecting the electrode 122 of second FBAR 120 to the electrode 152 of first FBAR 150 and connecting the electrode 124 of second FBAR 120 to the electrode 154 of first FBAR 150. Conductors 176 and 178 respectively electrically connect the electrodes 162 and 164, respectively, of the second FBAR 160 of second DSBAR 108 to outputs 32, 34.

In first DSBAR 106, modulated electrical signal $S_M$ received at inputs 26, 28 is fed via conductors 136 and 138, respectively, to the electrodes 112 and 114 of first FBAR 110. In first FBAR 110, electrodes 112 and 114 apply the electrical input signal to piezoelectric element 116. The electrical input signal applied to piezoelectric element 116 causes first FBAR 110 to vibrate mechanically. Acoustic decoupler 130 couples part of the acoustic signal generated by first FBAR 110 to second FBAR 120 and the acoustic signal causes FBAR 120 to vibrate. The piezoelectric element 126 of second FBAR 120 converts the mechanical vibration of second FBAR 120 to an intermediate electrical signal that is received by the electrodes 122 and 124 of second FBAR 120. Electrical circuit 140 couples the intermediate electrical signal from the electrodes 122 and 124 of the second FBAR 120 of first DSBAR 106 to the electrodes 152 and 154, respectively, of the first FBAR 150 of second DSBAR 108.

In second DSBAR 108, first FBAR 150 vibrates mechanically in response to the intermediate electrical signal applied to its piezoelectric element 156. Acoustic decoupler 170 couples part of the acoustic signal generated by first FBAR 150 to second FBAR 160, and the acoustic signal causes second FBAR 160 to vibrate. The piezoelectric element 166 of second FBAR 160 converts the mechanical vibration of second FBAR 160 to an electrical output signal $S_O$ that is received by the electrodes 162 and 164 of FBAR 160. Conductors 176 and 178 connect electrical output signal $S_O$ from electrodes 162 and 164 to outputs 32, 34, respectively.

The electrical output signal $S_O$ appearing between outputs 32, 34 has the same frequency and includes the information content of the modulated electrical signal $S_M$ applied between inputs 26, 28. Thus, acoustic coupler 100 effectively acoustically couples the modulated electrical signal $S_M$ from inputs 26, 28 to outputs 32, 34. Electrically-insulating acoustic decoupler 130 electrically insulates electrode 114 connected to input 28 from electrode 122 connected to electrode 152 and electrically-insulating acoustic decoupler 170 electrically insulates electrode 152 from electrode 164 connected to output 34. Hence, acoustic coupler 100 additionally electrically isolates outputs 32, 34 from inputs 26, 28.

In acoustic coupler 100, acoustic decoupler 130 controls the coupling of the acoustic signal generated by FBAR 110 to FBAR 120 and acoustic decoupler 170 controls the coupling of the acoustic signal generated by FBAR 150 to FBAR 160. Acoustic couplers 130 and 170 collectively control the bandwidth of acoustic coupler 100. Specifically, due to a substantial mis-match in acoustic impedance between acoustic decoupler 130 and FBARs 110 and 120, acoustic decoupler 130 couples less of the acoustic signal from FBAR 110 to FBAR 120 than would be coupled by direct contact between FBARs 110 and 120. Similarly, due to a substantial mis-match in acoustic impedance between acoustic decoupler 170 and FBARs 150 and 160, acoustic decoupler 170 couples less of the acoustic signal from FBAR 150 to FBAR 160 than would be coupled by direct contact between FBARs 150 and 160.

Modulated electrical signal $S_M$ passes through DSBARs 106 and 108 connected in series between inputs 26, 28 and outputs 32, 34. FIG. 3 shows with a broken line the frequency response characteristic of DSBAR 106 as an example of the frequency response characteristics of DSBAR 106 and DSBAR 108. DSBAR 106 exhibits a flat in-band response with a pass bandwidth of greater than 100 MHz, which is sufficiently broad to transmit the full bandwidth of an embodiment of modulated electrical signal $S_M$ resulting from modulating carrier signal $S_C$ with an embodiment of electrical information signal $S_I$ having a data rate greater than 100 Mbit/s. Each of the DSBARs subjects the electrical signal passing through it to the frequency response characteristic shown by the broken line in FIG. 3. The resulting frequency response of acoustic coupler 100 is shown by a solid line in FIG. 3. Acoustic coupler 100 has a flat in-band response and a steep transition between the pass band and the stop band. Moreover, the frequency response continues to fall as the frequency deviation from the center frequency increases, resulting in a large attenuation in the stop band.

Figure 4A:
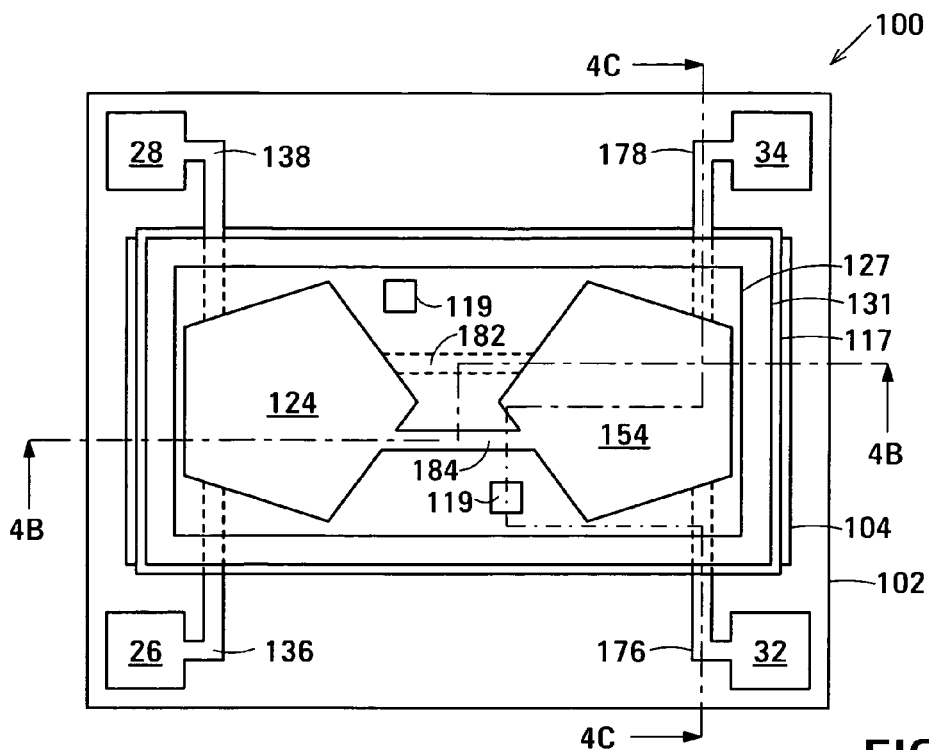
FIG. 4A is a plan view showing a practical example of the acoustic coupler shown in FIG. 2.
Figure 4B:
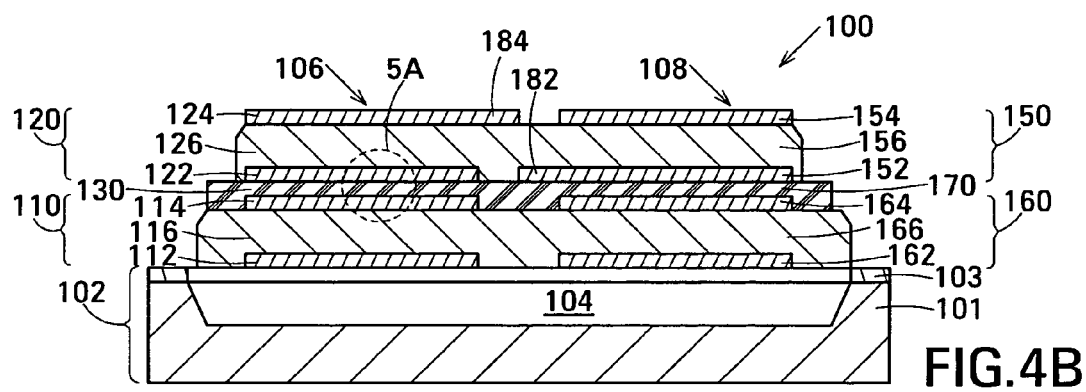
FIGS. 4B and 4C are cross-sectional views along section lines 4B-4B and 4C-4C, respectively, shown in FIG. 4A.
Figure 4C:
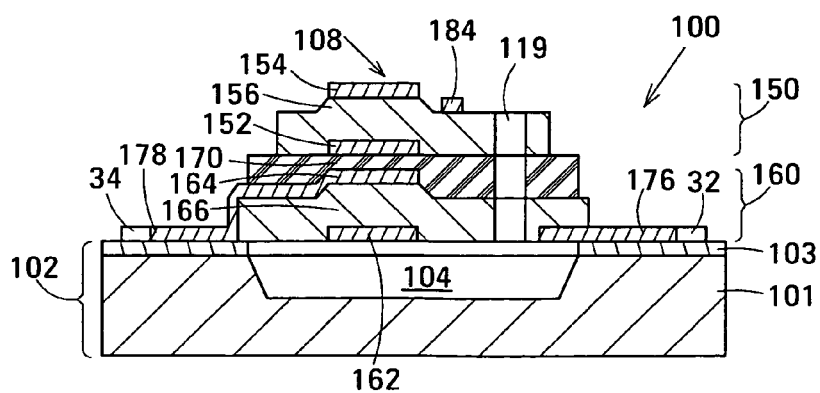

FIG. 4A is a schematic plan view showing a practical example of acoustic coupler 100. FIGS. 4B and 4C are cross-sectional views along section lines 4B-4B and 4C-4C, respectively, shown in FIG. 4A. The same reference numerals are used to denote the elements of acoustic coupler 100 in FIG. 2 and in FIGS. 4A-4C.

In the embodiment of acoustic coupler 100 shown in FIGS. 4A-4C, DSBAR 106 and DSBAR 108 are suspended over a common cavity 104 defined in a substrate 102. Suspending DSBARs 106 and 108 over a cavity allows the stacked FBARs 110 and 120 constituting DSBAR 106 and the stacked FBARs 150 and 160 constituting DSBAR 108 to resonate mechanically in response to modulated electrical signal $S_M$. Other suspension schemes that allow DSBARs 106 and 108 to resonate mechanically are possible. For example, DSBAR 106 and DSBAR 108 may be suspended over respective cavities defined in substrate 102. In another example, DSBAR 106 and DSBAR 108 are acoustically isolated from substrate 102 by an acoustic Bragg reflector (not shown), as described by John D. Larson III et al. in United States patent application publication no. 2005 0 104 690 entitled Cavity-Less Film Bulk Acoustic Resonator (FBAR) Devices, assigned to the assignee of this disclosure and incorporated by reference.

In the example shown in FIGS. 4A-4C, the material of substrate 102 is single-crystal silicon. Since single-crystal silicon is a semiconductor and is therefore not a good electrical insulator, substrate 102 is typically composed of a base layer 101 of single crystal silicon and an insulating layer 103 of dielectric material located on the major surface of the base layer. Exemplary materials of the insulating layer include aluminum nitride (AlN), silicon nitride ($Si_3N_4$), silicon dioxide ($SiO_2$), a polyimide, a crosslinked polyphenylene polymer and any other suitable electrically-insulating material. Insulating layer 103 insulates DSBARs 106 and 108 from base layer 101. Alternatively, the material of substrate 102 can be a ceramic material, such as alumina ($Al_2O_3$), that has a very high electrical resistivity and breakdown field.

In the example shown in FIGS. 4A-4C, a piezoelectric layer 117 of piezoelectric material provides piezoelectric elements 116 and 166 and a piezoelectric layer 127 of piezoelectric material provides piezoelectric elements 126 and 156. Additionally, in the example shown in FIGS. 4A-4C, a single acoustic decoupling layer 131 of acoustic decoupling material provides acoustic decouplers 130 and 170, as will be described in more detail below with reference to FIG. 5A.

In the example shown in FIGS. 4A-4C, inputs 26, 28 shown in FIG. 2 are embodied as terminal pads 26, 28 respectively, and outputs 32, 34 shown in FIG. 2 are embodied as terminal pads 32, 34, respectively. Terminal pads 26, 28, 32 and 34 are located on the major surface of substrate 102. Electrical circuit 140 shown in FIG. 2 is composed of an electrical trace 136 that extends from terminal pad 26 to electrode 112 of FBAR 110, an electrical trace 138 that extends from terminal pad 28 to electrode 114 of FBAR 110, an electrical trace 182 that extends from electrode 122 of FBAR 120 to electrode 152 of FBAR 150, an electrical trace 184 that extends from electrode 124 of FBAR 120 to electrode 154 of FBAR 150, an electrical trace 176 that extends from electrode 162 of FBAR 160 to terminal pad 32 and an electrical trace 178 that extends from electrode 164 of FBAR 160 to terminal pad 34. Electrical traces 136, 138, 176 and 178 all extend over part of the major surface of substrate 102. Additionally, electrical traces 136 and 176 extend under part of piezoelectric layer 117, electrical traces 138 and 178 extend over part of piezoelectric layer 117, electrical trace 182 extends over part of acoustic decoupling layer 131 and electrical trace 184 extends over part of piezoelectric layer 127.

In embodiments of acoustic galvanic isolator 10 (FIG. 1) in which local oscillator 12, modulator 14 and demodulator 18 are fabricated in and on substrate 102, terminal pads 26, 28, 32 and 34 are typically omitted and electrical traces 136 and 138 are extended to connect to corresponding traces constituting part of modulator 14 and electrical traces 176 and 178 are extended to connect to corresponding traces constituting part of demodulator 18.

Figure 5A:
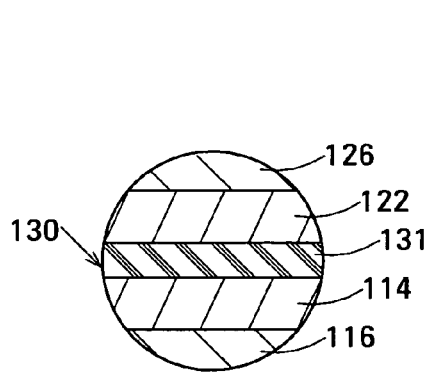
FIG. 5A is an enlarged view of the portion marked 5A in FIG. 4B showing a first embodiment of the acoustic decoupler.

FIG. 5A is an enlarged view of the portion marked 5A in FIG. 4B showing a first embodiment of electrically-insulating acoustic decoupler 130. The following description of electrically-insulating acoustic decoupler 130 also applies to electrically-insulating acoustic decoupler 170. Consequently, electrically-insulating acoustic decoupler 170 will not be separately described. In the embodiment shown in FIG. 5A, electrically-insulating acoustic decoupler 130 is composed of a quarter-wave acoustic decoupling layer 131 of electrically-insulating acoustic decoupling material. Acoustic decoupling layer 131 is located between the electrodes 114 and 122 of FBARs 110 and 120 (FIG. 4B), respectively, to provide acoustic decoupler 130 and is additionally located between electrodes 152 and 164 of FBARs 150 and 160 (FIG. 4B), respectively, to provide acoustic decoupler 170. Alternatively, separate acoustic decoupling layers (not shown) may be used to provide acoustic decouplers 130 and 170. The acoustic decoupling material of acoustic decoupling layer 131 has an acoustic impedance intermediate between that of air and that of the materials of FBARs 110 and 120, and additionally has a high electrical resistivity and a high breakdown voltage.

The acoustic impedance of a material is the ratio of stress to particle velocity in the material and is measured in Rayleighs, abbreviated as rayl. The piezoelectric material of the piezoelectric elements 116, 126, 156 and 166 of FBARs 110, 120, 150 and 160, respectively, is typically aluminum nitride (AlN) and the material of electrodes 112, 114, 122, 124, 152, 154, 162 and 164 is typically molybdenum (Mo). The acoustic impedance of AlN is typically about 35 Mrayl and that of molybdenum is about 63 Mrayl. The acoustic impedance of air is about 1 krayl.

Typically, the acoustic impedance of the electrically-insulating acoustic decoupling material of acoustic decoupling layer 131 is about one order of magnitude less that of the piezoelectric material that constitutes the piezoelectric elements 116 and 126 of FBARs 110 and 120, respectively. The bandwidth of the pass band of acoustic coupler 100 depends on the difference in acoustic impedance between the acoustic decoupling material of acoustic decoupling layer 131 and the materials of FBARs 110 and 120. In embodiments of acoustic decoupler 100 in which the materials of FBARs 110 and 120 are as stated above, acoustic decoupling materials with an acoustic impedance in the range from about 2 Mrayl to about 8 Mrayl will result in acoustic decoupler having a pass bandwidth sufficient to allow acoustic galvanic isolator 10 (FIG. 1) to operate at data rates greater than 100 Mb/s.

The main factors that determine the breakdown voltage between input terminals 22, 24 and output terminals 36, 38 of acoustic galvanic isolator 10 (FIG. 1) are the electrical breakdown field of the acoustic decoupling material of acoustic decoupling layer 131 and the thickness of acoustic decoupling layer 131 in acoustic coupler 100. Embodiments of acoustic coupler 100 in which acoustic decoupling layer 131 is a one quarter-wave layer typically couple modulated electrical signal $S_M$ from inputs 26, 28 to outputs 32, 34 with optimum signal integrity. An embodiment of acoustic coupler 100 in which acoustic decoupling layer 131 is thicker than a one quarter-wave layer typically has a frequency response that exhibits spurious response artifacts due to the ability of such thicker acoustic decoupling layer to support multiple acoustic modes. The spurious response artifacts tend to reduce the opening of the "eye" of the electrical output signal $S_O$ output by acoustic coupler 100. To ensure the integrity of the recovered electrical information signal $S_R$ output by acoustic galvanic isolator 10 (FIG. 1), embodiments in which acoustic coupler 100 has a layer thicker than a one quarter-wave layer as acoustic decoupling layer 131 typically need a more sophisticated type of clock and data recovery circuit in demodulator 18 than embodiments in which acoustic coupler 100 has a one quarter-wave layer (m=0) as acoustic decoupling layer 131. However, for a given acoustic decoupling material, an embodiment of acoustic coupler 100 having a layer thicker than a one quarter-wave layer as acoustic decoupling layer 131 typically provides acoustic coupler 100 with a greater breakdown voltage than an embodiment having a one quarter-wave layer as acoustic decoupling layer 131.

Acoustic decoupling layer 131 is formed by spin coating a precursor liquid for the electrically-insulating acoustic decoupling material over electrodes 114 and 164. An acoustic decoupling layer formed by spin coating will typically have regions of different thickness due to the contouring of the surface coated by the acoustic decoupling material. In such embodiments, the thickness of acoustic decoupling layer 131 is the thickness of the portion of the acoustic decoupling layer located between electrodes 114 and 122 and between electrodes 152 and 164.

Many materials are electrically insulating, have high breakdown fields and have acoustic impedances in the range stated above. Additionally, many such materials can be applied in layers of uniform thickness in the thickness ranges stated above. Such materials are therefore potentially suitable for use as the acoustic decoupling material of acoustic decoupling layer 131. However, the acoustic decoupling material must also be capable of withstanding the high temperatures of the fabrication operations performed after acoustic decoupling layer 131 has been deposited to form acoustic decouplers 130 and 170. In practical embodiments of acoustic coupler 100, electrodes 122, 124, 152 and 154 and piezoelectric layer 127 are deposited by sputtering after the acoustic decoupling material has been deposited. Temperatures as high as 400° C. are reached during these deposition processes. Thus, a material that remains stable at such temperatures is used as the acoustic decoupling material.

Typical acoustic decoupling materials have a very high acoustic attenuation per unit length compared with the other materials of FBARs 110, 120, 150 and 160. However, since the acoustic decoupling layer 131 is typically less than 1 μm thick, the acoustic attenuation introduced by acoustic decoupling layer 131 of acoustic decoupling material is typically negligible.

In one embodiment, a polyimide is used as the acoustic decoupling material of acoustic decoupling layer 131. Polyimide is sold under the trademark Kapton® by E. I. du Pont de Nemours and Company. In such embodiment, acoustic decoupler 130 and acoustic decoupler 170 are provided by acoustic decoupling layer 131 of polyimide applied by spin coating. Polyimide has an acoustic impedance of about 4 Mrayl and a breakdown field of about 165 kV/mm.

In another embodiment, a poly(para-xylylene) is used as the acoustic decoupling material of acoustic decoupling layer 131. In such embodiment, acoustic decoupler 130 and acoustic decoupler 170 are provided by acoustic decoupling layer 131 of poly(para-xylylene) applied by vacuum deposition. Poly(para-xylylene) is also known in the art as parylene. The dimer precursor di-para-xylylene from which parylene is made and equipment for performing vacuum deposition of layers of parylene are available from many suppliers. Parylene has an acoustic impedance of about 2.8 Mrayl and a breakdown field of about 275 kV/mm.

In another embodiment, a crosslinked polyphenylene polymer is used as the acoustic decoupling material of acoustic decoupling layer 131. In such embodiment, acoustic decoupler 130 and acoustic decoupler 170 are provided by acoustic decoupling layer 131 of the crosslinked polyphenylene polymer to electrode 114 applied by spin coating. Crosslinked polyphenylene polymers have been developed as low dielectric constant dielectric materials for use in integrated circuits and consequently remain stable at the high temperatures to which the acoustic decoupling material is subject during the subsequent fabrication of FBARs 120 and 160. Crosslinked polyphenylene polymers have a calculated acoustic impedance of about 2 Mrayl. This acoustic impedance is in the range of acoustic impedances that provides acoustic coupler 100 with a pass bandwidth sufficient for operation at data rates of over 100 Mbit/s.

Precursor solutions containing various oligomers that polymerize to form respective crosslinked polyphenylene polymers are sold by The Dow Chemical Company, Midland, Mich., under the registered trademark SiLK. The precursor solutions are applied by spin coating. The crosslinked polyphenylene polymer obtained from one of these precursor solutions designated SiLK™ J, which additionally contains an adhesion promoter, has a calculated acoustic impedance of 2.1 Mrayl, i.e., about 2 Mrayl. This crosslinked polyphenylene polymer has a breakdown field of about 400 kV/mm.

The oligomers that polymerize to form crosslinked polyphenylene polymers are prepared from biscyclopentadienone- and aromatic acetylene-containing monomers. Using such monomers forms soluble oligomers without the need for undue substitution. The precursor solution contains a specific oligomer dissolved in gamma-butyrolactone and cyclohexanone solvents. The percentage of the oligomer in the precursor solution determines the layer thickness when the precursor solution is spun on. After application, applying heat evaporates the solvents, then cures the oligomer to form a cross-linked polymer. The biscyclopentadienones react with the acetylenes in a 4+2 cycloaddition reaction that forms a new aromatic ring. Further curing results in the cross-linked polyphenylene polymer. The above-described crosslinked polyphenylene polymers are disclosed by Godschalx et al. in U.S. Pat. No. 5,965,679, incorporated herein by reference. Additional practical details are described by Martin et al., *Development of Low-Dielectric Constant Polymer for the Fabrication of Integrated Circuit Interconnect,* 12 ADVANCED MATERIALS, 1769 (2000), also incorporated by reference. Compared with polyimide, crosslinked polyphenylene polymers are lower in acoustic impedance, lower in acoustic attenuation, lower in dielectric constant and higher in breakdown field. Moreover, a spun-on layer of the precursor solution is capable of producing a high-quality film of the crosslinked polyphenylene polymer with a thickness of the order of 200 nm, which is a typical thickness of acoustic decoupling layer 131.

In an alternative embodiment, the acoustic decoupling material of acoustic decoupling layer 131 providing acoustic decoupler 130 and acoustic decoupler 170 is a material whose acoustic impedance is substantially greater than that of the materials of FBARs 110, 120, 150 and 160. No materials having this property are known at this time, but such materials may become available in future, or lower acoustic impedance FBAR materials may become available in future. The thickness of a quarter-wave layer of such high acoustic impedance acoustic decoupling material is as described above.

Figure 5B:
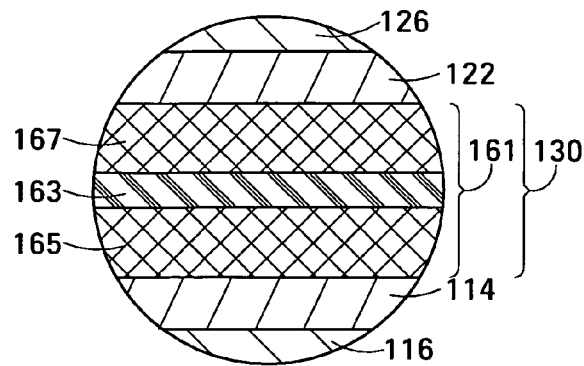
FIG. 5B is an enlarged view of the portion marked 5A in FIG. 4B showing a second embodiment of the acoustic decoupler.

FIG. 5B is an enlarged view of the portion marked 5A in FIG. 4B showing a second embodiment of electrically-insulating acoustic decoupler 130. Electrically-insulating acoustic coupler 170 can be similarly structured. The following description of acoustic decoupler 130 also applies to acoustic decoupler 170. Consequently, acoustic decoupler 170 will not be separately described. In the embodiment shown in FIG. 5B, acoustic decoupler 130 is composed of an electrically-insulating acoustic Bragg structure 161 located between electrode 114 of FBAR 110 and electrode 122 of FBAR 120. Acoustic Bragg structure 161 comprises a low acoustic impedance Bragg element 163 located between high acoustic impedance Bragg elements 165 and 167. At least one of the Bragg elements comprises a layer of material having a high electrical resistivity, a low dielectric permittivity and a high breakdown field.

Each of the Bragg elements 163, 165 and 167 is a quarter-wave layer. Low acoustic impedance Bragg element 163 is a quarter-wave layer of a low acoustic impedance material whereas high acoustic impedance Bragg elements 165 and 167 are each a quarter-wave layer of high acoustic impedance material. The acoustic impedances of the materials of the Bragg elements are characterized as "low" and "high" with respect to one another and with respect to the acoustic impedance of the piezoelectric material of piezoelectric elements 116 and 126. Common quarter-wave layers of materials are typically used to provide Bragg structure 161 of acoustic decoupler 130 and the Bragg structure (not shown) of acoustic decoupler 170. Alternatively, acoustic decouplers 130 and 170 can be composed of independent quarter-wave layers.

In one embodiment, low acoustic impedance Bragg element 163 is a quarter-wave layer of silicon dioxide ($SiO_2$), which has an acoustic impedance of about 13 Mrayl, and each of the high acoustic impedance Bragg elements 165 and 167 is a quarter-wave layer of the same material as electrodes 114 and 122, respectively, e.g., molybdenum, which has an acoustic impedance of about 63 Mrayl. Using the same material for high acoustic impedance Bragg element 165 and electrode 114 of FBAR 110 allows high acoustic impedance Bragg element 165 additionally to serve as electrode 114. Similarly, using the same material for high acoustic impedance Bragg element 167 and electrode 122 of FBAR 120 allows high acoustic impedance Bragg element 167 additionally to serve as electrode 122.

In an example, high acoustic impedance Bragg elements 165 and 167 are one quarter-wave layers of molybdenum, and low acoustic impedance Bragg element 163 is a one quarter-wave layer of $SiO_2$. In an embodiment in which the frequency of carrier signal $S_C$ is about 1.9 MHz, molybdenum high acoustic impedance Bragg elements 165 and 167 have a thickness of about 820 nm and $SiO_2$ low acoustic impedance Bragg element 163 has a thickness of about 260 nm.

An alternative material for low acoustic impedance Bragg element 163 is a crosslinked polyphenylene polymer such as the above-mentioned crosslinked polyphenylene polymer made from a precursor solution sold under the registered trademark SiLK by Dow Chemical Co. Examples of alternative materials for low acoustic impedance Bragg element 163 include zirconium oxide ($ZrO_2$), hafnium oxide (HfO), yttrium aluminum garnet (YAG), titanium dioxide ($TiO_2$) and various glasses. An alternative material for high impedance Bragg elements 165 and 167 is tungsten (W).

In the example just described, only one of the Bragg elements 163, 165 and 167 is insulating, and the breakdown voltage of acoustic coupler 100, and, hence, of acoustic galvanic isolator 10, is determined by the thickness of low acoustic impedance Bragg element 163 and the breakdown field of the material of low acoustic impedance Bragg element 163.

The breakdown voltage of acoustic coupler 100 can be increased by making all the Bragg elements 163, 165 and 167 constituting Bragg structure 161 of electrically-insulating material. In an exemplary embodiment, high acoustic impedance Bragg elements 163 and 167 are each a quarter-wave layer of silicon dioxide ($SiO_2$) and low impedance Bragg element 165 is a quarter-wave layer of a crosslinked polyphenylene polymer, such as the above-mentioned crosslinked polyphenylene polymer made from a precursor solution sold under the registered trademark SiLK by Dow Chemical Co. However, silicon dioxide has a relatively low breakdown field of about 30 kV/mm, and a quarter-wave layer of a typical crosslinked polyphenylene polymer is relatively thin due to the relatively low velocity of sound of this material. In another all-insulating embodiment of Bragg structure 161 having a substantially greater breakdown voltage, high acoustic impedance Bragg elements 163 and 167 are each a quarter-wave layer of aluminum oxide ($Al_2O_3$) and low impedance Bragg element 165 is a quarter-wave layer of silicon dioxide. Aluminum oxide has an acoustic impedance of about 44 Mrayl and a breakdown field of several hundred kilovolts/mm. Additionally, the velocity of sound in aluminum oxide is about seven times higher than in a typical crosslinked polyphenylene polymer. A given voltage applied across two quarter-wave layers of aluminum oxide and a quarter wave layer of silicon dioxide results in a much lower electric field than when applied across two quarter-wave layers of silicon dioxide and one quarter-wave layer of a crosslinked polyphenylene polymer.

Examples of alternative electrically-insulating materials for Bragg elements 163, 165 and 167 include zirconium oxide ($ZrO_2$), hafnium oxide (HfO), yttrium aluminum garnet (YAG), titanium dioxide ($TiO_2$) and various glasses. The above examples are listed in an approximate order of descending acoustic impedance. Any of the examples may be used as the material of the high acoustic impedance Bragg layers 165, 167 provided a material having a lower acoustic impedance is used as the material of the low acoustic impedance Bragg layer 163.

In embodiments of acoustic decoupler 130 in which the acoustic impedance difference between high acoustic impedance Bragg elements 165 and 167 and low acoustic impedance Bragg element 163 is relatively low, Bragg structure 161 may be composed of more than one (n) low acoustic impedance Bragg element interleaved with a corresponding number (n+1) of high acoustic impedance Bragg elements. For example, Bragg structure 161 may be composed of two low acoustic impedance Bragg elements interleaved with three high acoustic impedance Bragg elements. While only one of the Bragg elements need be electrically insulating, a higher breakdown voltage is obtained when more than one of the Bragg elements is electrically insulating.

Some galvanic isolators are required to have breakdown voltages greater than one kilovolt between their input terminals and output terminals. In acoustic coupler 100, electrically-insulating acoustic decouplers 130 and 170 in series collectively provide electrical isolation between inputs 26, 28 and outputs 32, 34. The electrical isolation provided by acoustic decouplers 130 and 170 may be insufficient to allow acoustic galvanic isolator 10 (FIG. 1) to meet high breakdown voltage requirements.

Additional embodiments of an acoustic coupler in accordance with the invention will be described next. In these embodiments, each DSBAR is an insulating decoupled stacked bulk acoustic resonator (IDSBAR) having one or more acoustically-resonant electrical insulators located between its constituent film bulk acoustic resonators (FBARs). The one or more acoustically-resonant electrical insulators of the IDSBARs are electrically connected in series to provide more electrical isolation between inputs 26, 28 and outputs 32, 34 than is provided by above-described series-connected electrically-insulating acoustic decouplers 130 and 170. Accordingly, these acoustic coupler embodiments have a substantially greater breakdown voltage than acoustic coupler 100 described above with reference to FIGS. 2 and 4A-4C.

Figure 6:
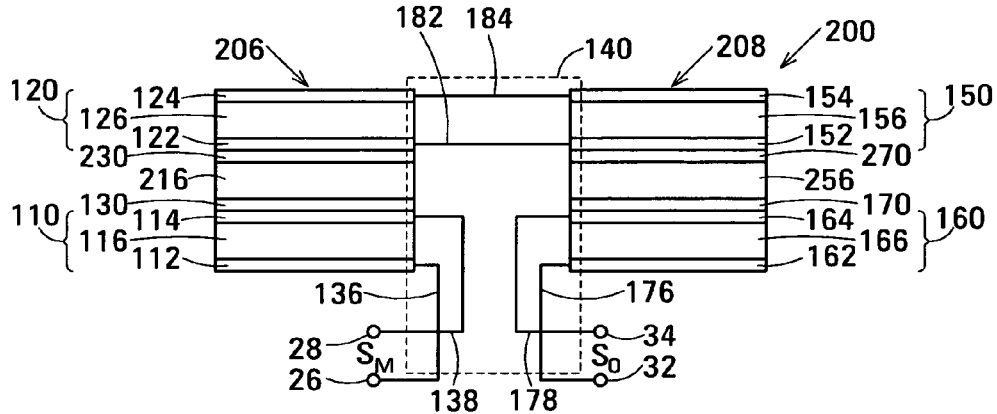
FIG. 6 is a schematic diagram showing an example of an acoustic coupler in accordance with a second embodiment of the invention that may be used as the electrically-isolating acoustic coupler of the acoustic galvanic isolator shown in FIG. 1.

FIG. 6 is a schematic diagram showing an example of an acoustic coupler 200 in accordance with a second embodiment of the invention. FIG. 7A is a plan view showing a practical example of acoustic coupler 200. FIGS. 7B and 7C are cross-sectional views along section lines 7B-7B and 7C-7C, respectively, shown in FIG. 7A. The same reference numerals are used to denote the elements of acoustic coupler 200 in FIG. 6 and in FIGS. 7A-7C.

Acoustic coupler 200 comprises inputs 26, 28, outputs 32, 34, a first insulating decoupled stacked bulk acoustic resonator (IDSBAR) 206, a second IDSBAR 208 and an electrical circuit 140 that connects IDSBAR 206 and IDSBAR 208 in series between inputs 26, 28 and outputs 32, 34. In acoustic coupler 200, each of IDSBAR 206 and IDSBAR 208 is an IDSBAR in accordance with a first IDSBAR embodiment. In its simplest form, an IDSBAR in accordance with the first IDSBAR embodiment has a first acoustic decoupler, a quarter-wave acoustically-resonant electrical insulator and a second acoustic decoupler in order between its constituent FBARs. The acoustically-resonant electrical insulators provide additional electrical insulation without impairing the transmission integrity of the modulated electrical signal $S_M$ from inputs 26, 28 to outputs 32, 34. IDSBAR 206 and IDSBAR 208 give acoustic coupler 200 a greater breakdown voltage than an otherwise similar embodiment of acoustic coupler 100 described above with reference to FIG. 2.

When used as electrically-isolating acoustic coupler 16 in acoustic galvanic isolator 10 shown in FIG. 1, acoustic coupler 200 acoustically couples modulated electrical signal $S_M$ from inputs 26, 28 to outputs 32, 34 while providing electrical isolation between inputs 26, 28 and outputs 32, 34. Thus, acoustic coupler 200 effectively galvanically isolates output terminals 36, 38 from input terminals 22, 24, and allows the output terminals to differ in voltage from the input terminals by a voltage up to its specified breakdown voltage.

In the example of acoustic coupler 200 shown in FIGS. 6 and 7A-7C, IDSBAR 206 comprises lower film bulk acoustic resonator (FBAR) 110, upper FBAR 120 stacked on FBAR 110 and, located in order between lower FBAR 110 and upper FBAR 120, first acoustic decoupler 130, a quarter-wave acoustically-resonant electrical insulator 216, and a second acoustic decoupler 230. IDSBAR 208 comprises lower FBAR 160, upper FBAR 150 stacked on FBAR 160 and, located in order between lower FBAR 160 and upper FBAR 150, first acoustic decoupler 170, a quarter-wave acoustically-resonant electrical insulator 256, and a second acoustic decoupler 270. Other embodiments of IDSBAR 206 and IDSBAR 208 each comprise two or more (n) quarter-wave acoustically-resonant electrical insulators interleaved with a corresponding number (n+1) of acoustic decouplers located between the respective FBARs.

Acoustically-resonant electrical insulators 216 and 256 are in series between inputs 26, 28 and outputs 32, 34 and electrically isolate outputs 32, 34 from inputs 26, 28 and vice versa. Consequently, acoustic decouplers 130, 170, 230 and 270 need not be electrically insulating in this embodiment. However, acoustic decouplers 130, 170, 230 and 270 are in series with acoustically-resonant electrical insulators 216 and 256 between inputs 26, 28 and outputs 32, 34 so that acoustic decouplers 130, 170, 230 and 270 that are electrically insulating provide additional isolation between outputs 32, 34 and inputs 26, 28 and vice versa. Accordingly, an embodiment of acoustic galvanic isolator 10 (FIG. 1) in which acoustic decouplers 130, 170, 230 and 270 are electrically insulating will typically have a higher breakdown voltage than one in which acoustic decouplers 130, 170, 230 and 270 are electrically conducting.

FBARs 110, 120, 150 and 160, first acoustic decouplers 130 and 170, electrical circuit 140 and substrate 102 are described above with reference to FIGS. 2 and 4A-4C and will not be described again here. The description of acoustic decoupler 130 and 170 set forth above additionally applies to acoustic decouplers 230 and 270. Accordingly, acoustic decouplers 230 and 270 will not be individually described. The exemplary embodiments of acoustic decoupler 130 described above with reference to FIGS. 5A and 5B may be used to provide each acoustic decoupler 130, 170, 230 and 270. One or more common quarter-wave layers of material may be used to provide both acoustic decoupler 130 and acoustic decoupler 170 and one or more common quarter-wave layers of material may be used to provide both acoustic decoupler 230 and acoustic decoupler 270. In the example shown in FIGS. 7A-7C, an acoustic decoupling layer 131 of acoustic decoupling material provides first acoustic decouplers 130 and 170. Additionally, one or more common quarter-wave layers of acoustic decoupling material may be used to provide both second acoustic decoupler 230 and second acoustic decoupler 270. In the example shown in FIGS. 7A-7C, an acoustic decoupling layer 231 of acoustic decoupling material provides second acoustic decouplers 230 and 270. Alternatively, acoustic decouplers 130, 170, 230 and 270 may each be independently provided.

Quarter-wave acoustically-resonant electrical insulator 216 will now be described. The following description also applies to quarter-wave acoustically-resonant electrical insulator 256. Therefore, acoustically-resonant electrical insulator 256 will not be individually described. Acoustically-resonant electrical insulator 216 is a quarter-wave layer of electrically-insulating material. Embodiments in which acoustically-resonant electrical insulator 216 is a one quarter-wave layer typically couple modulated electrical signal $S_M$ from inputs 26, 28 to outputs 32, 34 with optimum signal integrity.

Acoustically-resonant electrical insulator 216 transmits the acoustic signal generated by FBAR 110 to FBAR 120, but electrically insulates FBAR 120 from FBAR 110. Moreover, acoustic decouplers 130 and 230 are typically electrically insulating and provide additional electrical insulation between FBAR 110 and FBAR 120. Thus, acoustic coupler 200 effectively couples the modulated electrical signal $S_M$ from inputs 26, 28 to outputs 32, 34 but electrically isolates outputs 32, 34 from inputs 26, 28.

The electrically-insulating material of acoustically-resonant electrical insulator 216 is typically a dielectric or piezoelectric material matched in acoustic impedance to FBARs 110 and 120. For example, the material of acoustically-resonant electrical insulator 216 is the same as that of piezoelectric elements 116 and 126 of FBARs 110 and 120 respectively. In embodiments in which the material of acoustically-resonant electrical insulator 216 differs from that of piezoelectric elements 116 and 126, the difference in acoustic impedance is substantially less than one order of magnitude. In an example, the acoustic impedances have a ratio of less than two. Different materials are used for acoustically-resonant electrical insulator 216 and piezoelectric elements 116 and 126 in an embodiment in which the material of acoustically-resonant electrical insulator 216 is a dielectric, for example. Suitable dielectric materials for acoustically-resonant electrical insulator 216 include aluminum oxide ($Al_2O_3$) and non-piezoelectric (i.e., ceramic) aluminum nitride (AlN).

Although acoustically-resonant electrical insulator 216 is optimally a one quarter-wave layer, the velocity of sound in the typical piezoelectric and dielectric materials of acoustically-resonant electrical insulator 216 is substantially higher than in the materials of acoustic decouplers 130 and 230. Consequently, an acoustically-resonant electrical insulator 216 that is a one quarter-wave layer of aluminum nitride, for example, has a thickness about seven times that of a one quarter-wave layer of a typical acoustic decoupling material. As a result, a given voltage between inputs 26, 28 and outputs 32, 34 produces a much lower electric field when applied across such an embodiment of acoustically-resonant electrical insulator 216 than when applied across acoustic decoupler 130 in acoustic coupler 100 described above with reference to FIG. 2. Moreover, suitable piezoelectric and dielectric materials of acoustically-resonant electrical insulator 216 have a breakdown field comparable with that of typical acoustic decoupling materials. For example, samples of sputter-deposited aluminum nitride have a measured breakdown field of about 875 kV/mm. Consequently, acoustic coupler 200 typically has a greater breakdown voltage than acoustic coupler 100 shown in FIG. 2.

A common quarter-wave layer of electrically-insulating material may be used to provide both acoustically-resonant electrical insulator 216 and acoustically-resonant electrical insulator 256. In the example shown in FIGS. 7A-7C, a quarter-wave layer 217 of electrically-insulating material provides acoustically-resonant electrical insulators 216 and 256. Alternatively, acoustically-resonant electrical insulators 216 and 256 may be independently provided.

Figure 8:
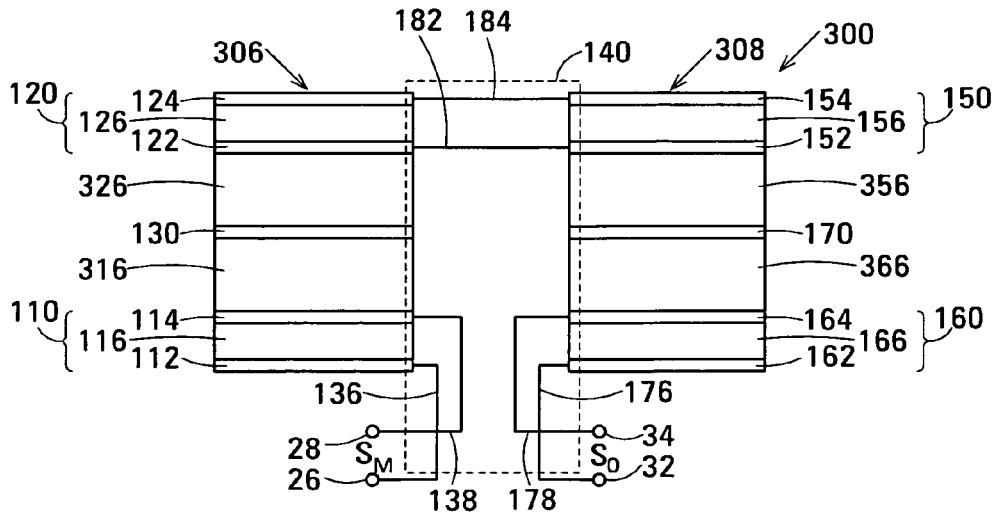
FIG. 8 is a schematic diagram showing an example of an acoustic coupler in accordance with a third embodiment of the invention that may be used as the electrically-isolating acoustic coupler of the acoustic galvanic isolator shown in FIG. 1.
Figure 9A:
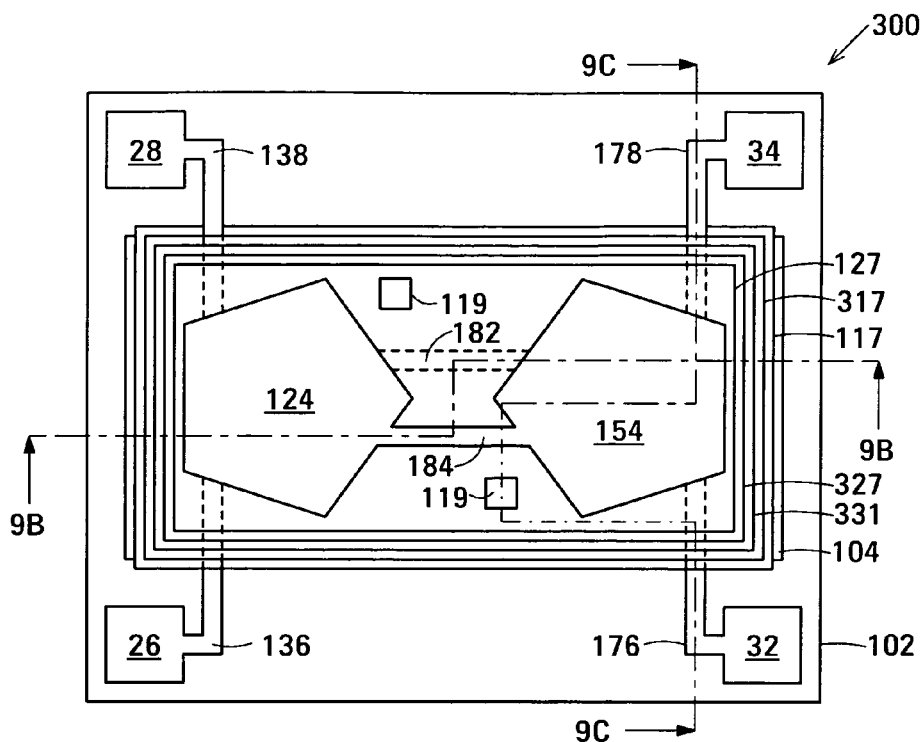
FIG. 9A is a plan view showing a practical example of the acoustic coupler shown in FIG. 8.
Figure 9B:
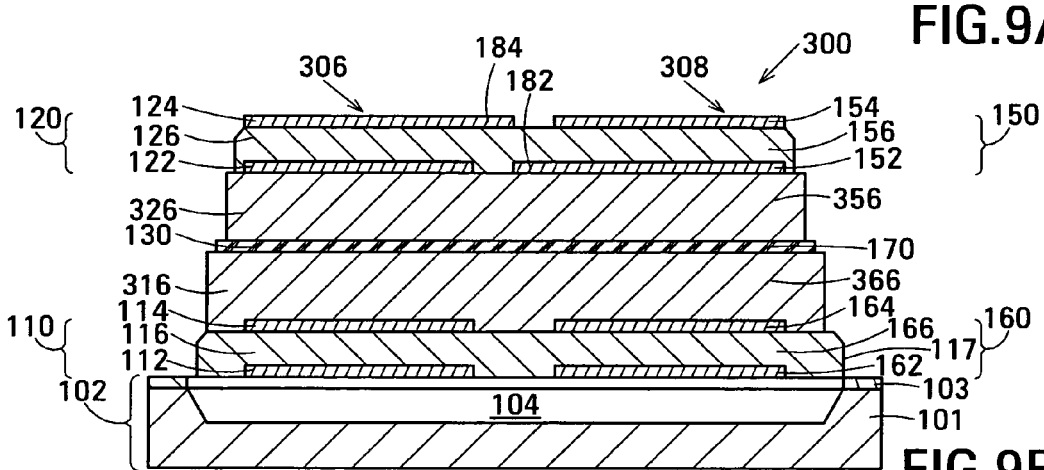
FIGS. 9B and 9C are cross-sectional views along section lines 9B-9B and 9C-9C, respectively, shown in FIG. 9A.
Figure 9C:
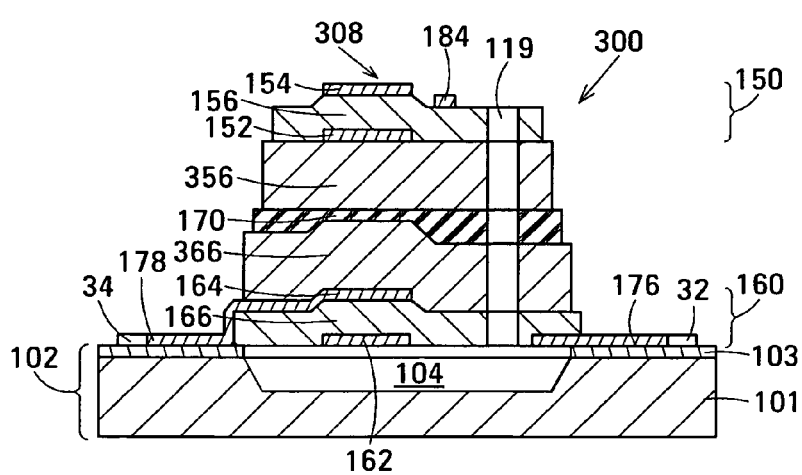

FIG. 8 is a schematic diagram showing an example of an acoustic coupler 300 in accordance with a third embodiment of the invention. FIG. 9A is a plan view showing a practical example of acoustic coupler 300. FIGS. 9B and 9C are cross-sectional views along section lines 9B-9B and 9C-9C, respectively, shown in FIG. 9A. The same reference numerals are used to denote the elements of acoustic coupler 300 in FIG. 8 and in FIGS. 9A-9C.

Acoustic coupler 300 comprises inputs 26, 28, outputs 32, 34, an insulated decoupled stacked bulk acoustic resonator (IDSBAR) 306, an IDSBAR 308 and electrical circuit 140 that connects IDSBARs 306 and 308 in series between the inputs and the outputs. In acoustic decoupler 300, each of IDSBARs 306 and 308 is an IDSBAR in accordance with a second IDSBAR embodiment. In its simplest form, an IDSBAR in accordance with the second IDSBAR embodiment has a first half-wave acoustically-resonant electrical insulator, an acoustic decoupler and a second half-wave acoustically-resonant electrical insulator in order between its constituent FBARs. The half-wave acoustically-resonant electrical insulators provide additional electrical insulation without impairing the transmission integrity of the modulated electrical signal $S_M$ from inputs 26, 28 to outputs 32, 34. IDSBAR 306 and IDSBAR 308 in accordance with the second IDSBAR embodiment gives acoustic coupler 300 a substantially greater breakdown voltage than acoustic coupler 100 described above with reference to FIG. 2 and acoustic coupler 200 described above with reference to FIG. 6.

When used as electrically-isolating acoustic coupler 16 in acoustic galvanic isolator 10 shown in FIG. 1, acoustic coupler 300 acoustically couples modulated electrical signal $S_M$ from inputs 26, 28 to outputs 32, 34 while providing electrical isolation between inputs 26, 28 and outputs 32, 34. Thus, acoustic coupler 300 effectively galvanically isolates output terminals 36, 38 from input terminals 22, 24, and allows the output terminals to differ in voltage from the input terminals by a voltage up to its specified breakdown voltage.

Each of IDSBAR 306 and IDSBAR 308 has a first half-wave acoustically-resonant electrical insulator, an acoustic decoupler and a second half-wave acoustically-resonant electrical insulator located in order between its FBARs. In the example of acoustic coupler 300 shown in FIG. 8, IDSBAR 306 comprises a lower film bulk acoustic resonator (FBAR) 110, an upper film bulk acoustic resonator 120 stacked on FBAR 110 and, located in order between FBAR 110 and FBAR 120, a first half-wave acoustically-resonant electrical insulator 316, acoustic decoupler 130 and a second half-wave acoustically-resonant electrical insulator 326. IDSBAR 308 comprises a lower film bulk acoustic resonator (FBAR) 160, an upper FBAR 150 stacked on FBAR 160 and, located in order between upper FBAR 150 and lower FBAR 160, a first half-wave acoustically-resonant electrical insulator 356, acoustic decoupler 170 and a second half-wave acoustically-resonant electrical insulator 366. In acoustic coupler 300, in each of IDSBAR 306 and IDSBAR 308, the half-wave acoustically-resonant electrical insulators are two in number and are twice as thick as acoustically-resonant electrical insulators 216 and 256 described above with reference to FIG. 6. Half-wave acoustically-resonant electrical insulators 316, 326, 356 and 366 therefore collectively provide approximately four times the electrical isolation collectively provided by acoustically-resonant electrical insulators 216 and 256. As a result, embodiments of acoustic coupler 300 have a greater breakdown voltage between inputs 26, 28 and outputs 32, 34 than otherwise similar embodiments of acoustic coupler 100 described above with reference to FIG. 2 and acoustic coupler 200 described above with reference to FIG. 6. Other embodiments of IDSBAR 306 and IDSBAR 308 each comprise an even number (2n) of half-wave acoustically-resonant electrical insulators interleaved with a corresponding number (2n−1) of acoustic decouplers located between the respective FBARs.

Half-wave acoustically-resonant electrical insulators 316, 326, 356 and 366 are in series between inputs 26, 28 and outputs 32, 34 and electrically isolate outputs 32, 34 from inputs 26, 28 and vice versa. Consequently, acoustic decouplers 130, 170, 230 and 270 need not be electrically insulating in this embodiment. However, acoustic decouplers 130 and 170 are in series with half-wave acoustically-resonant electrical insulators 316, 326, 356 and 366 between inputs 26, 28 and outputs 32, 34 so that acoustic decouplers 130 and 170 that are electrically insulating provide some additional electrical isolation between outputs 32, 34 and inputs 26, 28 and vice versa. Accordingly, an embodiment of acoustic galvanic isolator 10 (FIG. 1) in which acoustic decouplers 130 and 170 are electrically insulating will typically have a higher breakdown voltage than one in which acoustic decouplers 170 and 230 are electrically conducting.

FBARs 110, 120, 150 and 160, acoustic decouplers 130 and 170, electrical circuit 140 and substrate 102 are described above with reference to FIGS. 2 and 4A-4C and will not be described again here. The exemplary embodiments of acoustic decoupler 130 described above with reference to FIGS. 5A and 5B may be used to provide each acoustic decoupler 130 and 170. One or more common quarter-wave layers of material may be used to provide both acoustic decoupler 130 and acoustic decoupler 170. In the example shown in FIGS. 9A-9C, an acoustic decoupling layer 131 of acoustic decoupling material provides acoustic decouplers 130 and 170. Alternatively, acoustic decouplers 130 and 170 may each be independently provided.

Half-wave acoustically-resonant electrical insulator 316 will now be described. The following description also applies to half-wave acoustically-resonant electrical insulators 326, 356, and 366. Therefore, acoustically-resonant electrical insulators 326, 356, and 366 will not be individually described. Acoustically-resonant electrical insulator 316 is a half-wave layer of electrically-insulating material that is nominally matched in acoustic impedance to FBARs 110 and 120. Embodiments in which half-wave acoustically-resonant electrical insulator 316 is a one half-wave layer typically couple modulated electrical signal $S_M$ from inputs 26, 28 to outputs 32, 34 with optimum signal integrity.

At the center frequency of acoustic coupler 300, half-wave acoustically-resonant electrical insulator 316 and half-wave acoustically-resonant electrical insulator 326 are acoustically transparent. Half-wave acoustically-resonant electrical insulator 316 couples the acoustic signal generated by FBAR 110 to acoustic decoupler 130 and half-wave acoustically-resonant electrical insulator 326 couples the portion of the acoustic signal transmitted by acoustic decoupler 130 to FBAR 120. Thus, IDSBAR 306 has transmission characteristics similar to those of DSBAR 106 described above with reference to FIGS. 2, 3 (broken line) and 4A-4C. Additionally, half-wave acoustically-resonant electrical insulators 316 and 326 electrically isolate FBAR 120 from FBAR 110. Typically, acoustic decoupler 130 provides additional electrical isolation between FBARs 110 and 120 as described above. IDSBAR 308 has similar properties. Thus, acoustic coupler 300 effectively couples the modulated electrical signal $S_M$ from inputs 26, 28 to outputs 32, 34 but electrically isolates outputs 32, 34 from inputs 26, 28.

The materials described above with reference to FIGS. 6 and 7A-7C as being suitable for use as quarter-wave acoustically-resonant electrical insulator 216 are suitable for use as half-wave acoustically-resonant electrical insulators 316, 326, 356 and 366. The materials of half-wave acoustically-resonant electrical insulators 316, 326, 356 and 366 will therefore not be further described.

Half-wave acoustically-resonant electrical insulators 316, 326, 356 and 366 are each twice as thick as acoustically-resonant electrical insulator 216, and two half-wave acoustically-resonant electrical insulators 316 and 326 separate FBAR 120 from FBAR 110 and two half-wave acoustically-resonant electrical insulators 356 and 366 separate FBAR 160 from FBAR 150, which is electrically connected to FBAR 120. Moreover, the velocity of sound in the typical piezoelectric and dielectric materials of half-wave acoustically-resonant electrical insulators 316, 326, 356 and 366 is substantially higher than in typical acoustic decoupling materials. Consequently, embodiments of half-wave acoustically-resonant electrical insulators 316, 326, 356 and 366 that are one half-wave layers of aluminum nitride, for example, have a thickness about 14 times that of a one quarter-wave layer of a typical acoustic decoupling material. As a result, a given voltage between inputs 26, 28 and outputs 32, 34 produces a much lower electric field when applied across acoustically-resonant electrical insulators 316, 326, 356 and 366 and acoustic decouplers 130 and 170 than when applied across acoustic decouplers 130 and 170 in the embodiment of acoustic coupler 100 shown in FIGS. 2 and 4A-4C. Consequently, acoustic coupler 300 typically has a substantially greater breakdown voltage than acoustic coupler 100 shown in FIGS. 2 and 4A-4C.

A common half-wave layer of electrically-insulating material may be used to provide both half-wave acoustically-resonant electrical insulator 316 and half-wave acoustically-resonant electrical insulator 366, and a common half-wave layer of electrically-insulating material may be used to provide both half-wave acoustically-resonant electrical insulator 326 and half-wave acoustically-resonant electrical insulator 356. In the example shown in FIGS. 9A-9C, a half-wave layer 317 of electrically-insulating material provides half-wave acoustically-resonant electrical insulators 316 and 366, and a half-wave layer 327 of electrically-insulating material provides half-wave acoustically-resonant electrical insulators 326 and 356. Alternatively, acoustically-resonant electrical insulators 316, 326, 356 and 366 may be independently provided.

Figure 10:
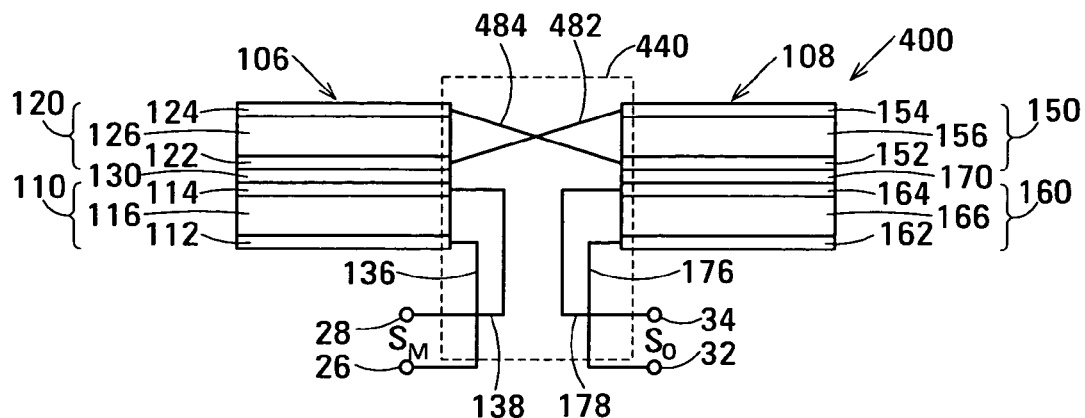
FIG. 10 is a schematic diagram showing an example of an acoustic coupler in accordance with a fourth embodiment of the invention that may be used as the electrically-isolating acoustic coupler of the acoustic galvanic isolator shown in FIG. 1.
Figure 11A:
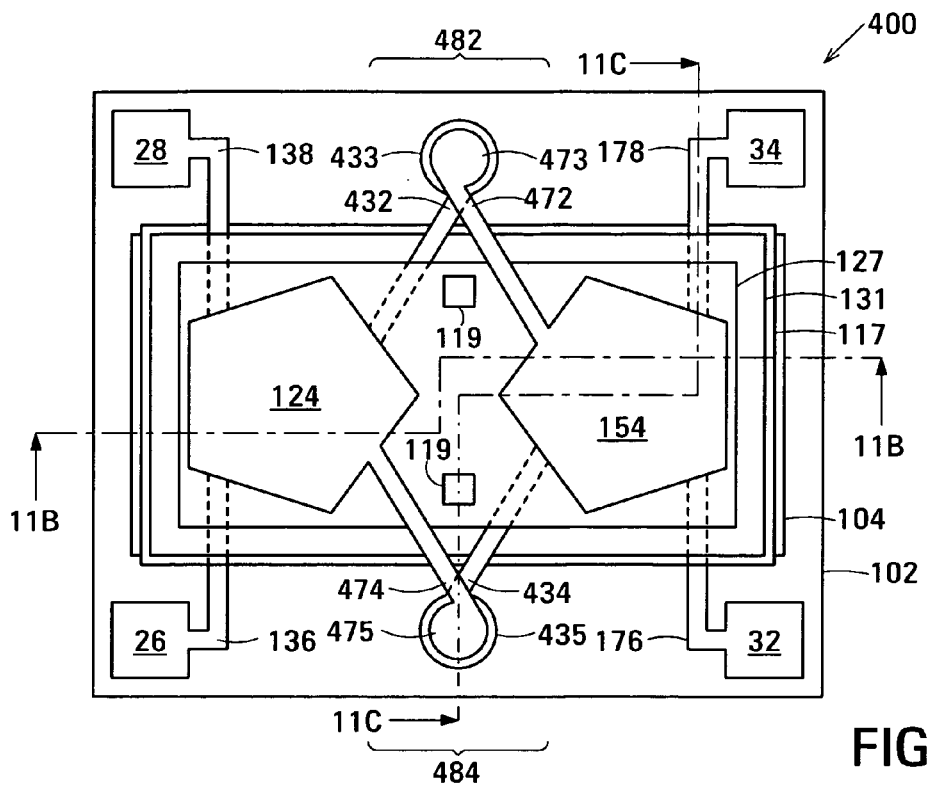
FIG. 11A is a plan view showing a practical example of the acoustic coupler shown in FIG. 10.
Figure 11B:
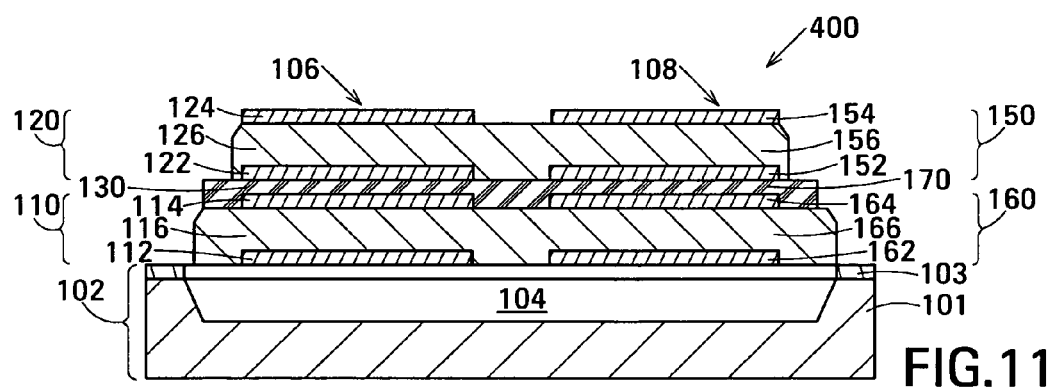
FIGS. 11B and 11C are cross-sectional views along section lines 11B-11B and 11C-11C, respectively, shown in FIG. 11.
Figure 11C:
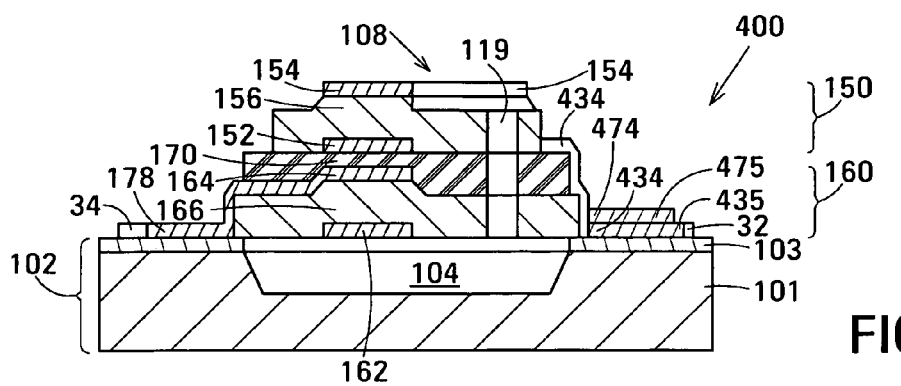

FIG. 10 is a schematic diagram showing an example of an acoustic coupler 400 in accordance with a fourth embodiment of the invention. FIG. 11A is a plan view showing a practical example of acoustic coupler 400. FIGS. 11B and 11C are cross-sectional views along section lines 11B-11B and 11C-11C, respectively, shown in FIG. 11A. The same reference numerals are used to denote the elements of acoustic coupler 400 in FIG. 10 and in FIGS. 11A-11C. Acoustic coupler 400 comprises inputs 26, 28, outputs 32, 34, decoupled stacked bulk acoustic resonator (DSBAR) 106, DSBAR 108 and electrical circuit 440 that connects DSBARs 106 and 108 in series between the inputs and the outputs. Acoustic coupler 400 provides a greater breakdown voltage than acoustic coupler 100 described above with reference to FIGS. 2 and 4A-4C without additional insulating layers.

When used as electrically-isolating acoustic coupler 16 in acoustic galvanic isolator 10 shown in FIG. 1, acoustic coupler 400 acoustically couples modulated electrical signal $S_M$ from inputs 26, 28 to outputs 32, 34 while providing electrical isolation between inputs 26, 28 and outputs 32, 34. Thus, acoustic coupler 400 effectively galvanically isolates output terminals 36, 38 from input terminals 22, 24, and allows the output terminals to differ in voltage from the input terminals by a voltage up to its specified breakdown voltage.

DSBARs 106 and 108 (including acoustic decouplers 130 and 170), substrate 102 of acoustic coupler 400 are identical in structure and operation to DSBARs 106 and 108 and substrate 102 of acoustic coupler 100 described above with reference to FIGS. 2 and 4A-4C and therefore will not be described again here.

Electrical circuit 440 differs from electrical circuit 140 of acoustic coupler 100 described above with reference to FIG. 2 as follows. In acoustic coupler 100, electrical circuit 140 connects DSBARs 106 and 108 in series between inputs 26, 28 and outputs 32, 34 by connecting FBAR 120 of DSBAR 106 in parallel with FBAR 150 of DSBAR 108. In acoustic coupler 400, electrical circuit 440 connects DSBARs 106 and 108 in series between inputs 26, 28 and outputs 32, 34 by connecting FBAR 120 of DSBAR 106 in anti-parallel with FBAR 150 of DSBAR 108. Connecting DSBARs 106 and 108 in series by connecting FBARs 120 and 150 in anti-parallel instead of in parallel locates the piezoelectric elements 126 and 156 of FBARs 120 and 150, respectively, in the electrical paths between inputs 26, 28 and outputs 32, 34, where piezoelectric elements 126 and 156 provide additional electrical isolation. Consequently, for a given piezoelectric material and piezoelectric element thickness and for a given acoustic decoupler structure and materials, acoustic coupler 400 has a breakdown voltage similar to that of acoustic coupler 200 described above with reference to FIG. 6 but is simpler to fabricate, since it has fewer constituent layers. Acoustic coupler 400 has the same number of constituent layers as acoustic coupler 100 described above with reference to FIG. 2, but acoustic coupler 100 has a lower breakdown voltage.

In electrical circuit 440, conductor 482 connects electrode 122 of FBAR 120 of DSBAR 106 to electrode 154 of FBAR 150 of DSBAR 108 and conductor 484 connects electrode 124 of FBAR 120 of DSBAR 106 to electrode 124 of FBAR 150 of DSBAR 108. Of the eight possible electrical paths between inputs 26, 28 and outputs 32, 34, the two electrical paths between input 28 and output 34, one via conductor 484 and one via conductor 482, are the shortest and therefore most susceptible to electrical breakdown. Electrical circuit 440 locates piezoelectric element 126 in series with acoustic decouplers 130 and 170 in the electrical path via conductor 484 between input 28 and output 34 and additionally locates piezoelectric element 156 in series with acoustic decouplers 130 and 170 in the electrical path via conductor 482 between input 28 and output 34. The piezoelectric material of piezoelectric elements 126 and 156 typically has a high resistivity and a high breakdown field, and piezoelectric elements 126 and 156 are each typically substantially thicker than acoustic decouplers 130 and 170 that are the sole providers of electrical isolation in above-described acoustic coupler 100. Consequently, for similar dimensions, materials and layer thicknesses, acoustic coupler 400 therefore typically has a greater breakdown voltage than acoustic coupler 100 described above with reference to FIGS. 2 and 4A-4C. Typically, for similar dimensions, materials and layer thicknesses, acoustic coupler 400 has a breakdown voltage similar to that of acoustic decoupler 200 described above with reference to FIGS. 6 and 7A-7C, but is simpler to fabricate because it has fewer layers.

In acoustic coupler 400, the electrical isolation provided by piezoelectric elements 126 and 156 means that acoustic couplers 130 and 170 need not be electrically insulating. However, embodiments of acoustic coupler 400 in which acoustic couplers 130 and 170 are electrically insulating typically have a greater breakdown voltage than embodiments in which acoustic couplers 130 and 170 are not electrically insulating.

In the practical example of acoustic coupler 400 shown in FIGS. 11A-11C, inputs 26, 28 shown in FIG. 10 are embodied as terminal pads 26, 28 respectively, and outputs 32, 34 shown in FIG. 10 are embodied as terminal pads 32, 34, respectively. Terminal pads 26, 28, 32 and 34 are located on the major surface of substrate 102. Electrical circuit 440 shown in FIG. 10 is comprises an electrical trace 136 that extends from terminal pad 26 to electrode 112 of FBAR 110, an electrical trace 138 that extends from terminal pad 28 to electrode 114 of FBAR 110, an electrical trace 176 that extends from electrode 162 of FBAR 160 to terminal pad 32 and an electrical trace 178 that extends from electrode 164 of FBAR 160 to terminal pad 34.

Additionally, electrical circuit 440 comprises connection pads 433 and 435 located on the major surface of substrate 102 and connection pads 473 and 475 located in electrical contact with connection pads 433 and 435, respectively. An electrical trace 432 extends from electrode 122 of FBAR 120 to connection pad 433 and an electrical trace 472 extends from electrode 154 of FBAR 150 to connection pad 473 in electrical contact with connection pad 433. Connection pads 433, 473 and electrical traces 432 and 472 collectively constitute conductor 482 that connects electrode 122 of FBAR 120 to electrode 154 of FBAR 150. An electrical trace 434 extends from electrode 152 of FBAR 150 to connection pad 435 and an electrical trace 474 extends from electrode 124 of FBAR 120 to connection pad 475 in electrical contact with connection pad 435. Connection pads 435, 475 and electrical traces 434 and 474 collectively constitute conductor 484 that connects electrode 152 of FBAR 150 to electrode 124 of FBAR 120.

Electrical traces 136, 138, 176 and 178 all extend over part of the major surface of substrate 102, electrical traces 136 and 176 extend under part of piezoelectric layer 117, and electrical traces 138 and 178 extend over part of piezoelectric layer 117. Additionally, electrical traces 432 and 434 extend over acoustic decoupling layer 131, parts of piezoelectric layer 117 and parts of the major surface of substrate 102 and electrical traces 472 and 474 extend over piezoelectric layer 126, parts of acoustic decoupling layer 131, parts of piezoelectric layer 117 and parts of the major surface of substrate 102.

In some embodiments of acoustic galvanic isolator 10, modulator 14 is fabricated in and on the same substrate 102 as electrically-isolating acoustic coupler 16. In such embodiments, terminal pads 26 and 28 are typically omitted and electrical traces 133 and 173 are extended to connect to corresponding traces constituting part of modulator 14. Additionally or alternatively, demodulator 18 is fabricated in and on the same substrate 102 as electrically-isolating acoustic coupler 16. In such embodiments, terminal pads 32 and 34 are typically omitted and electrical traces 135 and 175 are extended to connect to corresponding traces constituting part of demodulator 18.

Thousands of acoustic galvanic isolators similar to acoustic galvanic isolator 10 are fabricated at a time by wafer-scale fabrication. Such wafer-scale fabrication makes the acoustic galvanic isolators inexpensive to fabricate. The wafer is selectively etched to define a cavity in the location of the electrically-isolating acoustic coupler 16 of each acoustic galvanic isolator to be fabricated on the wafer. The cavities are filled with sacrificial material and the surface of the wafer is planarized. The local oscillator 12, modulator 14 and demodulator 18 of each acoustic galvanic isolator to be fabricated on the wafer are fabricated in and on the surface of the wafer using conventional semiconductor fabrication processing. The fabricated circuit elements are then covered with a protective layer. Exemplary materials for the protective layer are aluminum nitride and silicon nitride.

Embodiments of acoustic coupler 100 described above with reference to FIGS. 4A-4C, acoustic coupler 400 described above with reference to FIGS. 11A-11C are then fabricated by sequentially depositing and patterning the following layers: a first layer of electrode material, a first layer of piezoelectric material, a second layer of electrode material, a layer of acoustic decoupling material or the layers of an acoustic Bragg structure, a third layer of electrode material, a second layer of piezoelectric material and a fourth layer of electrode material. These layers form the DSBARs and the electrical circuit of each acoustic coupler. The electrical circuit additionally connects the DSBARs in series and to exposed connection points on modulator 14 and demodulator 18.

Embodiments of acoustic coupler 200 described above with reference to FIGS. 7A-7C are fabricated as just described, except that a quarter-wave layer 217 of electrically-insulating material and one or more layers constituting acoustic decouplers 230 and 270 are deposited and patterned after the one or more layers constituting acoustic decouplers 130 and 170 have been deposited and patterned. Embodiments of acoustic coupler 300 described above with reference to FIGS. 9A-9C are fabricated as just described, except that a first half-wave layer 317 of electrically-insulating material is deposited and patterned before, and a second half-wave layer 327 of electrically-insulating material is deposited and patterned after, the one or more layers constituting acoustic decouplers 130 and 170 have been deposited and patterned.

After the acoustic couplers have been fabricated, the sacrificial material is removed to leave each series-connected pair of DSBARs suspended over its respective cavity. Access holes shown at 119 provide access to the sacrificial material to facilitate removal. The protective material is then removed from the fabricated circuit elements. The substrate is then divided into individual acoustic galvanic isolators each similar to acoustic galvanic isolator 10. An exemplary process that can be used to fabricate DSBARs is described in more detail in United States patent application publication no. 2005 0 093 654, assigned to the assignee of this disclosure and incorporated by reference, and can be adapted to fabricate the DSBARs of the acoustic galvanic isolators described above.

Alternatively, acoustic couplers 100, 200, 300 or 400 are fabricated on a different wafer from that on which local oscillators 12, modulators 14 and demodulators 18 are fabricated. In this case, the acoustic galvanic isolators may be made by using a wafer bonding process to join the respective wafers to form a structure similar to that described by John D. Larson III et al. with reference to FIGS. 8A-8E of United States patent application publication no. 2005 0 093 659, assigned to the assignee of this disclosure and incorporated by reference.

In a further alternative, local oscillators 12, modulators 14 and acoustic couplers 100, 200, 300 or 400 are fabricated on one wafer and corresponding demodulators 18 are fabricated on the other wafer. The wafers are then bonded together as just described to form the acoustic galvanic isolators. Alternatively, the local oscillators 12 and modulators 14 are fabricated on one wafer and the acoustic couplers 100, 200, 300 or 400 and demodulators 18 are fabricated on the other wafer. The wafers are then bonded together as just described to form the acoustic galvanic isolators.

In another alternative suitable for use in applications in which the acoustic galvanic isolators are specified to have a large breakdown voltage between input terminals 22, 24 and output terminals 36, 38, multiple input circuits each comprising an instance of local oscillator 12 and an instance of modulator 14 and multiple output circuits each comprising an instance of demodulator 18 are fabricated in and on a semiconductor wafer. The wafer is then singulated into individual semiconductor chips each embodying a single input circuit or a single output circuit. The electrically-isolating acoustic coupler 16 of each acoustic galvanic isolator is fabricated suspended over a cavity defined in a ceramic wafer having conductive traces located on its major surface. For each acoustic galvanic isolator fabricated on the wafer, one semiconductor chip embodying an input circuit and one semiconductor chip embodying an output circuit are mounted on the ceramic wafer in electrical contact with the conductive traces. For example, the semiconductor chips may be mounted on the ceramic wafer by ball bonding or flip-chip bonding. Ceramic wafers with attached semiconductor chips can also be used in the above-described two wafer structure.

In an exemplary embodiment of acoustic galvanic isolator 10 operating at a carrier frequency of about 1.9 GHz, the material of electrodes 112, 114, 122, 124, 152, 154, 162 and 164 is molybdenum. Each of the electrodes has a thickness of about 300 nm and is pentagonal in shape with an area of about 12,000 square μm. A different area gives a different characteristic impedance. The non-parallel sides of the electrodes minimize lateral modes in FBARs 110, 120, 150 and 160 as described by Larson III et al. in U.S. Pat. No. 6,215,375, assigned to the assignee of this disclosure and incorporated by reference. The metal layers in which electrodes 112, 114, 122, 124, 152, 154, 162 and 164 are defined are patterned such that, in respective planes parallel to the major surface of the wafer, electrodes 112 and 114 of FBAR 110 have the same shape, size, orientation and position, electrodes 122 and 124 of FBAR 120 have the same shape, size, orientation and position, electrodes 152 and 154 of FBAR 150 have the same shape, size, orientation and position, and electrodes 162 and 164 of FBAR 160 have the same shape, size, orientation and position. Typically, electrodes 114 and 122 additionally have the same shape, size, orientation and position and electrodes 152 and 164 additionally have the same shape, size, orientation and position. Alternative electrode materials include such metals as tungsten, niobium and titanium. The electrodes may have a multi-layer structure.

The material of piezoelectric elements 116, 126, 156 and 166 is aluminum nitride. Each piezoelectric element has a thickness of about 1.4 μm. Alternative piezoelectric materials include zinc oxide, cadmium sulfide and poled ferroelectric materials such as perovskite ferroelectric materials, including lead zirconium titanate (PZT), lead metaniobate and barium titanate.

Possible structures and materials for acoustic decouplers 130 and 170 are described above with reference to FIGS. 5A and 5B.

In embodiments of acoustic coupler 200 described above with reference to FIGS. 7A-7C, the material of quarter-wave acoustically-resonant electrical insulators 216 and 256 is aluminum nitride. Each acoustically-resonant electrical insulator has a thickness of about 1.4 μm. Alternative materials include aluminum oxide ($Al_2O_3$) and non-piezoelectric aluminum nitride. Possible structures and materials for acoustic decouplers 230 and 270 are described above with reference to FIGS. 5A and 5B.

In embodiments of acoustic coupler 300 described above with reference to FIGS. 9A-9C, the material of half-wave acoustically-resonant electrical insulators 316, 326, 356 and 366 is aluminum nitride. Each half-wave acoustically-resonant electrical insulator has a thickness of about 2.8 μm. Alternative materials include aluminum oxide ($Al_2O_3$) and non-piezoelectric aluminum nitride.

In the above-described example of acoustic galvanic isolator 10, inputs 26, 28 are connected to FBAR 110 of DSBAR 106 and outputs 32, 34 are connected to FBAR 160 of DSBAR 108. In other embodiments, inputs 26, 28 are connected to either of the FBARs of one of the DSBARs 106 and 108, and outputs 32, 34 are connected to either of the FBARs of the other of the DSBARs 106 and 108.

Figure 12:
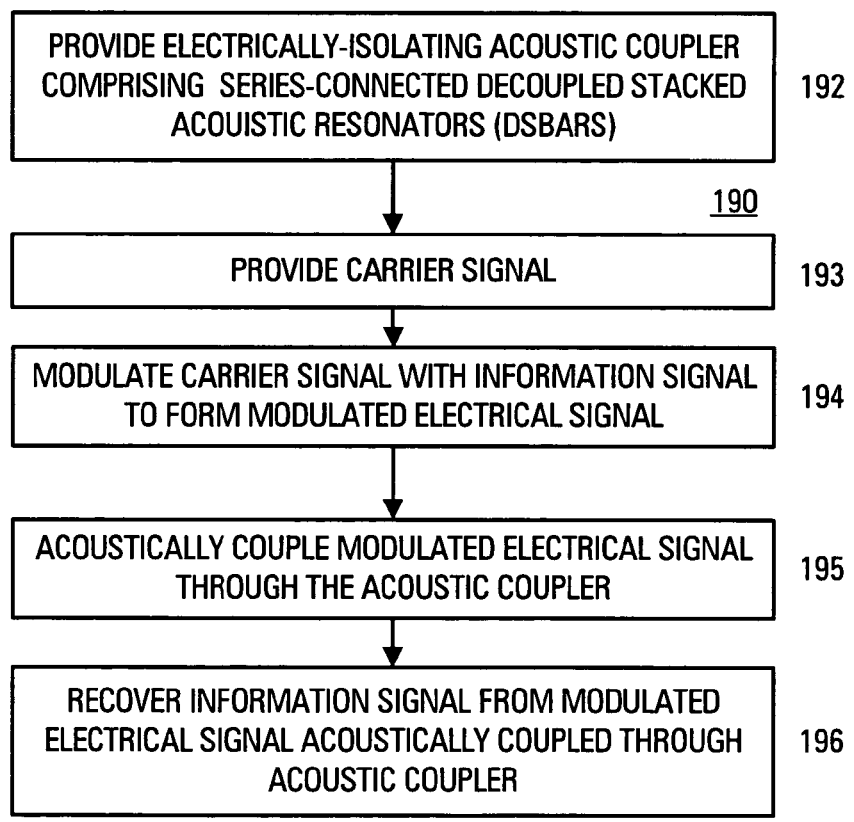
FIG. 12 is a flow chart showing an example of a method in accordance with an embodiment of the invention for galvanically isolating an information signal.

FIG. 12 is a flow chart showing an example of a method 190 in accordance with an embodiment of the invention for galvanically isolating an information signal. In block 192, an electrically-isolating acoustic coupler is provided. The electrically-isolating acoustic coupler comprises series-connected decoupled stacked acoustic resonators. In block 193, a carrier signal is provided. In block 194, the carrier signal is modulated with the information signal to form a modulated electrical signal. In block 195, the modulated electrical signal is acoustically coupled through the electrically-isolating acoustic coupler. In block 196, the information signal is recovered from the modulated electrical signal acoustically coupled though the acoustic coupler.

This disclosure describes the invention in detail using illustrative embodiments. However, the invention defined by the appended claims is not limited to the precise embodiments described.

We claim:

1. A galvanic isolator, comprising:
   a carrier signal source;
   a modulator connected to receive an information signal and the carrier signal; a demodulator; and
   connected between the modulator and the demodulator, an electrically-isolating acoustic coupler comprising:
      a first decoupled stacked bulk acoustic resonator (DSBAR) comprising an acoustically-resonant electrical insulator, and a second DSBAR comprising acoustically-resonant electrical insulator, each of the DSBARs further comprising: a first film bulk acoustic resonator (FBAR); a second FBAR and an acoustic decoupler between the first FBAR and the second FBAR, wherein the DSBARs are connected in series; and
      each of the DSBARs further comprises an additional acoustic decoupler between the FBARs; and the acoustically-resonant electrical insulator comprises a quarter-wave layer of electrically-insulating material located between the acoustic decoupler and the additional acoustic decoupler.

2. The galvanic isolator of claim 1, in which an electrical circuit connects the first FBAR of the first DSBAR to the modulator and the first FBAR of the second DSBAR to the demodulator.

3. The galvanic isolator of claim 2, in which the electrical circuit connects the second FBARs of the DSBARs in parallel to connect the DSBARs in series.

4. The galvanic isolator of claim 3, in which: each of the FBARs comprises an opposed pair of electrodes and a piezoelectric element between the electrodes; and the electrical circuit comprises: a first electrical connection between a first one of the electrodes of the second FBAR of the first DSBAR and a first one of the electrodes of the second FBAR of the second DSBAR, and a second electrical connection between a second one of the electrodes of the second FBAR of the first DSBAR and a second one of the electrodes of the second FBAR of the second DSBAR, the second ones of the electrodes being closer to the acoustic decouplers of the DSBARs than the first ones of the electrodes.

5. The galvanic isolator of claim 2, in which the electrical circuit connects the second FBARs of the DSBARs in anti-parallel to connect the DSBARs in series.

6. The galvanic isolator of claim 5, in which: each of the FBARs comprises an opposed pair of electrodes and a piezoelectric element between the electrodes; and the electrical circuit comprises: a first electrical connection between a first one of the electrodes of the second FBAR of the first DSBAR and a second one of the electrodes of the second FBAR of the second DSBAR, and a second electrical connection between a second one of the electrodes of the second FBAR of the first DSBAR and a first one of the electrodes of the second FBAR of the second DSBAR, the second ones of the electrodes being closer to the acoustic decouplers of the DSBARs than the first ones of the electrodes.

7. The galvanic isolator of claim 1, in which the acoustically-resonant electrical insulator comprises a layer of electrically-insulating material differing in acoustic impedance from the FBARs by less than one order of magnitude.

8. The galvanic isolator of claim 1, in which the acoustically-resonant electrical insulator comprises a layer of electrically-insulating material matched in acoustic impedance with the FBARs.

9. A galvanic isolator, comprising:
a carrier signal source;
a modulator connected to receive an information signal and the carrier signal;
a demodulator; and connected between the modulator and the demodulator, an electrically-isolating acoustic coupler comprising: a first decoupled stacked bulk acoustic resonator (DSBAR) and a second DSBAR connected in series to the first DSBAR, each of the DSBARs comprising:
a first film bulk acoustic resonator (FBAR), a second FBAR, and an acoustic decoupler between the first FBAR and the second FBAR, and an acoustically-resonant electrical insulator comprising a first half-wave acoustically-resonant electrical insulator, and a second half-wave acoustically-resonant electrical insulator, wherein the acoustic decoupler is located between the first half-wave acoustically-resonant electrical insulator and the second half-wave acoustically-resonant electrical insulator.

10. The galvanic isolator of claim 9, in which each of the half-wave acoustically-resonant electrical insulator comprises a half-wave layer of electrically-insulating material.

* * * * *